United States Patent
Kashihara et al.

(10) Patent No.: US 6,882,069 B1
(45) Date of Patent: Apr. 19, 2005

(54) VEHICLE AC GENERATOR WITH RECTIFIER DIODE PACKAGE DISPOSED BETWEEN COOLING PLATES

(75) Inventors: Toshiaki Kashihara, Tokyo (JP); Yoshihiro Kashiba, Tokyo (JP); Shigeki Maekawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 250 days.

(21) Appl. No.: 09/705,792

(22) Filed: Nov. 6, 2000

(30) Foreign Application Priority Data

Jun. 8, 2000 (JP) .................................. 2000-172152

(51) Int. Cl.[7] .............................................. H02K 19/36
(52) U.S. Cl. ..................... 310/68 D; 363/141; 363/145; 257/688
(58) Field of Search ....................... 310/68 D; 363/141, 363/145; 257/688

(56) References Cited

U.S. PATENT DOCUMENTS

| | | | |
|---|---|---|---|
| 3,538,362 A | * 11/1970 | Cheetham et al. | ......... 310/68 D |
| 3,818,584 A | 6/1974 | Suenaga et al. | |
| 4,303,935 A | * 12/1981 | Ragaly | ......... 357/76 |
| 4,328,512 A | * 5/1982 | Heyke et al. | ......... 357/76 |
| 5,451,823 A | * 9/1995 | Deverall et al. | ......... 310/68 D |
| 5,729,063 A | 3/1998 | Adachi et al. | ......... 310/68 D |
| 5,828,564 A | * 10/1998 | Mori et al. | ......... 363/141 |
| 5,883,450 A | * 3/1999 | Abadia et al. | ......... 310/68 D |
| 5,886,403 A | * 3/1999 | Yoshinaga et al. | ......... 257/688 |
| 5,950,068 A | * 9/1999 | Einthoven | ......... 438/39 |
| 5,982,062 A | * 11/1999 | Gautier | ......... 310/68 D |

FOREIGN PATENT DOCUMENTS

| | | |
|---|---|---|
| DE | 28 56 193 | 2/1981 |
| GB | 2 210 201 A | 6/1989 |
| GB | 2 334 815 A | 9/1999 |
| JP | 5-176539 | 7/1993 |
| JP | 7-231656 | 8/1995 |

OTHER PUBLICATIONS

Translation of JP 05–176,539; Jul. 1993.*

* cited by examiner

Primary Examiner—Karl Tamai
(74) Attorney, Agent, or Firm—Sughrue Mion, PLLC

(57) ABSTRACT

A vehicle AC generator having a rectifier unit with cooling plates for the positive-electrode and negative-electrode sides, each having principal planes opposing each other; and a diode package disposed between the cooling plates for the positive-electrode and negative-electrode sides. The diode package has a base for the positive-electrode side formed of a metallic plate and joined to a cathode face of the unidirectionally conducting element for the positive-electrode side; a base for the negative-electrode side formed of a metallic plate and joined to an anode face of the unidirectionally conducting element for the negative-electrode side; and an insulating resin provided so that the unidirectionally conducting elements for the positive-electrode and negative-electrode sides are embedded therein. The end face of the base for the positive-electrode side is joined to the principal plane of the cooling plate for the positive-electrode side while the end face of the base for the negative-electrode side is joined to the principal plane of the cooling plate for the negative-electrode side.

17 Claims, 23 Drawing Sheets

VEHICLE AC GENERATOR WITH RECTIFIER DIODE PACKAGE DISPOSED BETWEEN COOLING PLATES

BACKGROUND OF THE INVENTION

1. Field of the Invention

The present invention relates to vehicle AC generators for equipping passenger vehicles and trucks, and in particular relates to a structure of a rectifier unit applied to the vehicle AC generator.

2. Description of the Related Art

FIG. 21 is a sectional view showing a structure of a conventional vehicle AC generator disclosed in Japanese Unexamined Patent Application Publication No. 8-182279, for example; FIG. 22 is a bottom plan view showing a rectifier unit for equipping the conventional vehicle AC generator; FIG. 23 is a schematic representation for showing an assembly procedure of a stator and the rectifier unit in the conventional vehicle AC generator; and FIG. 24 is a circuit diagram showing an example circuit of the conventional vehicle AC generator.

As shown in FIG. 21, the conventional vehicle AC generator is formed so that a Lundell-type rotor 7 is rotatably fitted in a case 3 formed of a front bracket 1 and a rear bracket 2, which are made of aluminum, via a shaft 6 while a stator 8 is secured to the internal wall of the case 3 so as to cover the external peripheral side of the rotor 7.

The shaft 6 is rotatably mounted on the front bracket 1 and the rear bracket 2 via a pair of bearings 14a and 14b, respectively. At one end of the shaft 6, a pulley 4 is secured so that a rotating torque of an engine can be transmitted to the shaft 6 via a belt (not shown). At the other end of the shaft 6, slip rings 9 for supplying an electric current to the rotor 7 are secured, so that a pair of brushes 10 are accommodated in a brush holder 11 disposed in the case 3 so as to touch the slip rings 9 slidably. A voltage regulator 17 for regulating the AC voltage generated in the stator 8 is adhered to a heat sink 18 fitted to the brush holder 11. A rectifier unit 12 electrically connected to the stator 8 for rectifying the AC current generated in the stator 8 into a DC current is equipped in the case 3.

The rotor 7 is formed of a rotor coil 13 for generating magnetic flux by passing through an electric current and a pair of Lundell-type pole cores 20 and 21 disposed so as to cover the rotor coil 13, magnetic poles being formed in the pair of pole cores 20 and 21 by the magnetic flux generated by the rotor coil 13. The pair of pole cores 20 and 21 are made of iron, each has a plurality of claw-shaped magnetic poles 22 and 23 projecting from an outer circumferential edge thereof at spaced even angular pitch in the circumferential direction, and the pole cores 20 and 21 are secured to the shaft 6 so as to mesh with the claw-shaped magnetic poles 22 and 23 by opposing them, respectively. Axial-flow fans. 5a and 5b are respectively secured as cooling means to both end faces of the pole cores 20 and 21 in the axial direction.

The stator 8 is formed of a stator core 15 and a stator coil 16 having a conductor wound around the sator core 15 and generating an AC current by changes in magnetic flux caused from the rotor 7 accompanied by the rotation of the rotor 7. Parts of the conductor wound around the stator core 15 extend to both ends of the stator core 15 in the axial direction so as to form a coil end 16f in the front side and a coil end 16r in the rear side, respectively. In addition, the stator coil 16 is an Y-three-phase winding formed by Y-connecting three coils.

The rectifier unit 12 is provided with diode 30a for the positive-electrode side, diode 30b for the negative-electrode side, a cooling plate 31 for the positive-electrode side for supporting the diode 30a, and a cooling plate 32 for the negative-electrode side for supporting the diode 30b. The cooling plates 31 and 32 have a plurality of straight heat-radiation fins 31a and 32a which protrude at right angle to the shaft 6 and extend in parallel with the shaft 6. The diodes 30a are aligned at predetermined intervals on the principal plane of the cooling plate 31, i.e., the plane opposite to the plane having the heat-radiation fins 31a formed thereon. The planar base electrode surfaces of the diodes 30a are connected to the principal plane of the cooling plate 31 by soldering. Similarly, the diodes 30b also are aligned at predetermined intervals on the principal plane of the cooling plate 32. The cooling plates 31 and 32 are combined such that the rear surfaces of the diodes 30a and 30b oppose each other diametrically. Pairs of leads 30a1 and 39b1 of the diodes 30a and 30b extend in parallel to the shaft 6 together with connection terminals 33a of a circuit board 33 and are soldered to leads 16a through 16c and 16n of the stator coil 16 introduced by a guide 34a of a partition plate 34, respectively.

As shown by the circuit diagram in FIG. 24, the three-phase AC voltage generated from each output terminal of the stator coil 16 is rectified in the full-wave by three sets of diode bridges comprising the diode 30a and the diode 30b, and a ripple-current component is output by one set of diode bridges comprising the diode 30a and the diode 30b via an Y-connected neutral point of the stator coil 16 so that the output current is improved. Therefore, the rectifier unit 12 is provided with four diodes 30a for the positive-electrode side and four diodes 30b for the negative-electrode side.

The diode 30a for the positive-electrode side has a planar electrode in the cathode side of a unidirectionally conducting element and a lead 30a1 in the anode side of the unidirectionally conducting element, and are constructed to be of a substantially rectangular parallelepiped resin-molded type package. The diode 30b has planar electrode in the anodes side of the unidirectionally conducting element and a lead 30b1 in the cathode side of the unidirectionally conducting element, and are constructed to be a substantially rectangular parallelepiped resin-molded type package.

In addition, in the case of the circuit diagram shown in FIG. 25, a rectifier unit 12A has only three sets of diode bridges comprising the diode 30a for the positive-electrode side and the diode 30b for the negative electrode side for performing full-wave-rectification of the three-phase AC voltage generated from each output terminal of the stator coil 16.

In the vehicle AC generator formed as above, a current is supplied from a battery (not shown) to the rotor coil 13 via the brushes 10 and the slip rings 9 so as to generate the magnetic flux. By the magnetic flux, the claw-shaped magnetic poles 22 of the pole core 20 are polarized with north-seeking (N) poles while the claw-shaped magnetic poles 23 of the other pole core 21 are polarized with south-seeking (S) poles. On the other hand, the rotating torque of the engine is transmitted to the shaft 6 via the belt and the pulley 4 so that the rotor 7 is rotated. Therefore, a rotating magnetic field is imparted to the stator coil 16 so as to generate an electromotive force in the stator coil 16. The AC electromotive force is rectified into a DC current by the rectifier unit 12, while the amount thereof is adjusted by the voltage regulator 17 so as to be charged in the battery.

In the vehicle AC generator, the rotor coil 13, the stator coil 16, the rectifier unit 12, and the voltage regulator 17 are generating heat at all times during the generation, wherein in the generator of a class operating at the rated 100 A output, they generate heat of 60 W, 500 W, 120 W. and 6 W, respectively, at a rotational speed showing high temperature.

Therefore, in order to cool the heat produced by the generation, air intake openings 1a and 2a and air discharge openings 1b and 2b are provided in the front bracket 1 and the rear bracket 2, respectively. Specifically, as shown in FIG. 21, a plurality of air intake openings 1a and 2a are provided on the axial faces (end faces) of both the brackets 1 and 2 so as to oppose the rectifier unit 12 and the in voltage regulator 17, while a plurality of air discharge openings 1b and 2b are provided in the vicinities of the external peripheries of the axial-flow fans 5a and 5b on the radial faces (side faces) of both the brackets 1 and 2.

In the front side, as shown by the solid lines in FIG. 21, ambient air is sucked in the case 3 from the air intake openings 1a by the rotation of the axial-flow fan 5a in the front side, and then is curved in the centrifugal direction by the axial-flow fan 5a, and thereby cooling a coil end portion 16f in the front side of the stator coil 16 so as to be thereafter exhausted from the air discharge openings 1b.

On the other hand, in the rear side, as shown by the dotted lines in FIG. 21, ambient air is sucked in the case 3 from the air intake openings 2a by the rotation of the axial-flow fan 5b in the rear side so as to cool the rectifier unit 12 and the voltage regulator 17, and then is curved in the centrifugal direction by the axial-flow fan 5b, and thereby cooling a coil end portion 16r in the rear side of the stator coil 16 so as to be thereafter exhausted from the air discharge openings 2b.

Next, a conventional rectifier unit using a cooling plate formed to be substantially horseshoe-shaped will be described.

FIGS. 26 to 28 are a perspective view, a front view, and a rear elevational view, respectively, of another conventional rectifier unit disclosed in Japanese Unexamined Patent Application Publication No. 8-182279; FIG. 29 is a sectional view showing an essential part of the structure of the rectifier unit shown in FIG. 26; and FIGS. 30 and 31 are an essential part sectional view and an essential part front view, respectively, showing the flow of cooling air in a vehicle AC generator equipping with the rectifier unit shown in FIG. 26.

In the conventional rectifier unit 12B, cooling plates 35 and 36 for the positive- and negative-electrode sides are respectively formed in a horseshoe shape. The cooling plate 35 for the positive-electrode side has a plurality of heat-radiation fins 35a extending radially on the rear plane, i.e., the face opposite to the principal plane. Diodes 30a for the positive-electrode side are aligned at predetermined intervals in the circumferential direction on the principal plane of the cooling plate 35. The planar base electrode surface of the diode 30a is connected to the principal plane of the cooling plate 35 by soldering. Similarly, the diodes 30b also are aligned in the circumferential direction at predetermined intervals on the principal plane of the cooling plate 36. The cooling plates 35 and 36 are coaxially placed such that their principal planes are positioned on a plane orthogonal to the axis of the shaft 6. At this time, the diodes 30a and 30b oppose each other diametrically. Pairs of leads 30al and 30bl of the respective diodes 30a and 30b extend in parallel to the shaft 6 together with connection terminals 37a of a circuit board 37 and are soldered to leads 16a through 16c and 16n of the stator coil 16.

In the vehicle AC generator equipping with the rectifier unit 12B formed as above, as shown by the dotted lines in FIGS. 30 and 31, ambient air is sucked in the case 3 from the air intake openings 2a by the rotation of the axial-flow fan 5b in the rear side so as to impinge upon the cooling plate 35; flows along the heat-radiation fins 35a thereof toward the shaft 6; flows toward the rotor 7 via between the shaft 6 and the cooling plate 35; and then is curved in the centrifugal direction by the axial-flow fan 5b, and thereby cooling a coil end portion 16r in the rear side of the stator coil 16 so as to be thereafter exhausted from the air discharge openings 2b.

Next, the conventional rectifier unit disclosed in Japanese Unexamined Patent Application Publication No. 7-231656 will be described. FIG. 32 is a front view of the conventional rectifier unit disclosed in Japanese Unexamined Patent Application Publication No. 7-231656, for example, and FIG. 33 is a sectional view showing a rectifier element forming the rectifier unit shown in FIG. 32.

In FIG. 33, the rectifier element 38 comprises a cylindrical metallic case 39 having a bottom, a unidirectionally conducting element 40b for the negative-electrode side with the anode side soldered to the internal bottom face of the case 39, a unidirectionally conducting element 40a for the positive-electrode side with the anode side soldered to the cathode side of the unidirectionally conducting element 40b via a planar metallic plate 41, a connection terminal 42 soldered to the cathode side of the unidirectionally conducting element 40a, and a sealing material 43 made from an insulating resin and packed into the case 39. The external peripheral surface of the case 39 is knurled. The planar plate 41 extends from the opening of the case 39 to form a lead 41a. Similarly, the connection terminal 42 extends from the opening of the case 39 to form a lead 42a. The rectifier element 38 forms a diode bridge comprising the unidirectionally conducting elements 40a and 40b for the positive- and negative-electrode sides.

In FIG. 32, a heat-radiation plate 44 has three concave portions formed at predetermined intervals. A terminal base 45 is constructed to be of an insulating-resin-molded type package comprising one of a first conductor portion 45a and three of second conductor portions 45b. The rectifier elements 38 formed as above are respectively press-fitted into the three concave portions formed on the principal plane of the heat-radiation plate 44; the terminal base 45 is placed on the heat-radiation plate 44; the lead 41a of each rectifier element 38 is soldered to the first conductor portion 45a; and the lead 42a of each rectifier element 38 is soldered to the second conductor portion 45b, and thereby forming a three-phase full-wave rectifier unit 12C.

Furthermore, the conventional rectifier unit disclosed in Japanese Unexamined Patent Application Publication No. 5-176539 will be described. FIG. 34 is a sectional view of the conventional rectifier unit disclosed in Japanese Unexamined Patent Application Publication No. 5-176539, for example.

In FIG. 34, a radiating fin 47 for the positive-electrode side is connected to cathodes of four diodes 46a for the positive-electrode side and to output terminals (not shown). An anodes of each diode 46a for the positive-electrode side is individually connected to four cathodes of the diodes 46b via an AC heat-radiation fin 48, which is individually connected to the leads of the stator coil. An anode of each diode 46b for the negative-electrode side is connected to a heat-radiation fin 49 for the negative-electrode side, which is grounded via a frame 50. A rectifier unit 12D formed as above forms a four-phase full-wave-rectifying bridge.

The heat-radiation fin 49 for the negative-electrode side is formed by bending an aluminum plate to have a channel shape and has both ends fixed to the frame 50 with screws 51. The central portion of the heat-radiation fin 49 extends in parallel with the surface of the frame 50 leaving a predetermined space therebetween. An indented hole 52 and a ventilation hole 53 are formed in the central portion of the heat-radiation fin 49. Into the indented hole 52, a knurled portion 56 forming the anode of the diode 46b for the negative-electrode side is press-fitted and is fixed, while the body portion of the diode. 46b is disposed in the side of the frame 50 of the heat-radiation fin 49.

A knurled portion 56 forming the cathode of the diode 46b extends downwardly, when viewed in FIG. 34, and is press-fitted into the upper half of an indented hole 54 of the rectangular and planar AC heat-radiation fin 48 made of an aluminum plate. Into the lower half of the indented hole 54 of the AC heat-radiation fin 48, a knurled portion 56 forming the anode of the diode 46a for the positive-electrode side is press-fitted, and the knurled portion 56 forming the cathode of the diode 46b directly abuts the knurled portion 56 forming the anode of the diode 46a.

A knurled portion 56 forming the cathode of the diode 46a is press-fitted into an indented hole 55 of the rectangular and planar heat-radiation fin 47 made of an aluminum plate, which is pushed to the rear end wall of the frame 50 via an insulating sheet 57.

FIG. 35 is a sectional view of another conventional rectifier unit disclosed in Japanese Unexamined Patent Application Publication No. 5176539.

In the rectifier unit 12E shown in FIG. 35, the heat-radiation fin 47 for the positive-electrode side is used as a bending member at the outermost section instead of the heat-radiation fin 49 for the negative-electrode side, and the frame 50 is used as both the frame and the heat-radiation fin 49. The heat-radiation fin 47 is fixed to the frame 50 with resin screws 51a via the insulating sheet 57.

The simplification of the structure of the rectifier unit 12E is made by such a manner.

In the conventional rectifier unit 12 shown in FIG. 22, since the diodes 30a and 30b for the positive- and negative-electrode sides are separately formed, a large part of the heat generated in the diodes 30a and 30b is thermally conducted to the cooling plates 31 and 32 for the positive- and negative-electrode sides, respectively, so as to be dissipated therefrom. A part of the heat generated in the diode 30a (30b) is thermally conducted from the lead 30al (30bl) to the cooling plate 32 (31) via the connection terminal 33a and the lead 30bl (30al) so as to be dissipated from the cooling plate 32 (31). However, since the thermal resistance between the lead 30al, the connection terminals 33a, and the lead 30bl is large, the structure is formed to be difficult to perform heat-exchange between the diodes 30a and 30b with each other. That is, the heat generated in the diodes 30a and 30b is dissipated independently from the cooling plates 31 and 32, respectively, so that when the heating value of the diode 30a is unbalanced with that of the diode 30b, there has been a problem that the diode having a larger heating value cannot be effectively cooled. That is, there has been a problem that increasing in temperature of the diode having a larger heating value cannot be restrained. In addition, the conventional rectifier unit 12B shown in FIG. 26 also involves this problem.

Also, in the conventional rectifier unit 12B, the cooling plates 35 and 36 for the positive- and negative-electrode sides formed in a horseshoe shape are coaxially placed such that their principal planes are positioned on a plane orthogonal to the axis of the shaft 6, so that the passage for cooling air between the cooling plate 35 and the shaft 6 is narrow, and thereby increasing the ventilation resistance so as to reduce the amount of cooling air. Consequently, there has been a problem that increasing in temperatures of the rectifier unit 12B and the stator coil 16 cannot be restrained.

Furthermore, in the conventional rectifier units 12, 12A, and 12B, when forming n sets of three-phase full-wave rectifier units, 12n or 16n diodes 30a and 30b for the positive- and negative-electrode sides are needed, so that the man-hour of joining operations between the diode and the cooling plate and between the diode and the lead of the stator coil is increased, and thereby raising a problem that the productivity is reduced and space saving is not achieved as well so as to increase the size of the vehicle AC generator.

Also, in the conventional rectifier unit 12C shown in FIG. 32, since the unidirectionally conducting elements 40a and 40b for the positive- and negative-electrode sides are deposited in one piece, when forming n sets of three-phase full-wave rectifier units, it is advantageous in view of improvement in productivity and miniaturizing of the vehicle AC generator because the number of the rectifier elements 38 is reduced. However, the joining area between the connection terminal 42 and the unidirectionally conducting element 40a for the positive-electrode side is small relative to the base area in the cathode side of the unidirectionally conducting element 40a, the thermal resistance between the unidirectionally conducting element 40a and the connection terminal 42 becomes large. Also, since the conductor portion 45a, which is connected to the lead 42a of the connection terminal 42, is molded with an insulating resin, thermal dissipation of the conductor portion 45a is small. Therefore, the heat generated in the unidirectionally conducting element 40a for the positive-electrode side is thermally conducted to the heat-radiation plate 44 via the unidirectionally conducting element 40b for the negative-electrode side and the case 39 to be dissipated from the heat-radiation plate 44, and thereby raising a problem that temperature increase in the unidirectionally conducting element cannot be effectively restrained.

In the conventional rectifier unit 12D shown in FIG. 34, the knurled portion 56 forming the cathode of the diode 46a for the positive-electrode side is press-fitted into the indented hole 55 of the heat-radiation fin 47 for the positive-electrode side, which is pushed to the frame 50 via the insulating sheet 57. Therefore, the heat generated in the diode 46a for the positive-electrode side is thermally conducted to the heat-radiation fin 47 for the positive-electrode side; however the heat in the heat-radiation fin 47 is difficult to be thermally conducted to the frame 50, and thereby raising a problem that temperature increase in the diode 46a for the positive-electrode side cannot be effectively restrained. When the thickness of the insulating sheet 57 is reduced, electric corrosion is produced between the heat-radiation fin 47 and the frame 50 so as to cause failed generation.

In the conventional rectifier unit 12E shown in FIG. 35, the knurled portion 56 forming the cathode of the diode 46a is press-fitted into the indented hole 55 of the heat-radiation fin 47 for the positive-electrode side so as to be fixed to the frame 50 with the resin screws 51a via the insulating sheet 57. Therefore, the heat generated in the diode 46a for the positive-electrode side is thermally conducted to the heat-radiation fin 47 for the positive-electrode side; however the heat in the heat-radiation fin 47 is difficult to be thermally conducted to the frame 50, and thereby raising a problem that temperature increase in the diode 46a for the positive-electrode side cannot be effectively restrained. There also has been a problem that the screw 51a is subject to a large sheared stress to be damaged because large vehicle vibration and the thermal cycle .are applied to the resin screw 51a.

In the conventional rectifier units 12D and 12E, since the process of press-fitting the knurled portions 56 into the indented holes 52, 54, and 55 is repeated during the assembling the diodes 46a and 46b for the positive- and negative-electrode sides, so that a compression load is applied to the diodes 46a and 46b, and thereby raising a problem of the damaged diodes 46a and 46b.

Furthermore, in the conventional rectifier units 12D and 12E, since the screws 51 and 51a for fixing are needed for every pair of the diodes 46a and 46b for the positive- and negative-electrode sides, the number of parts is increased and the space for fixing is needed as well. Therefore, when forming n sets of three-phase full-wave rectifier units, there has been a problem that productivity is reduced and the size of the vehicle AC generator is increased as well.

SUMMARY OF THE INVENTION

In order to solve the above-mentioned problems, it is an object of the present invention to provide a vehicle AC generator capable of restraining temperature increase in the of unidirectionally conducting elements of a rectifier unit by efficiently dissipating the heat produced in the elements and also capable of reducing the assembling man-hour by reducing the number of parts of the rectifier unit and as well of restraining the damage of the elements during the assembly of the rectifier unit, wherein the unidirectionally conducting elements for the positive- and negative-electrode sides are deposited in one piece interposing an AC input terminal therebetween and then metallic plate bases are joined to both ends of the deposited unidirectionally conducting elements, and thereby forming the rectifier unit.

In accordance with the present invention, there is provided a vehicle AC generator comprising: a case; a shaft journaled in the case; a rotor secured to the shaft so as to be disposed in the case; a stator supported by the case so as to be disposed to cover the external periphery of the rotor; ventilating means rotated together with the rotor; and a rectifier unit cooled by the ventilating means, the rectifier unit comprising: cooling plates for the positive-electrode and negative-electrode sides disposed at a predetermined interval and each having principal planes opposing each other; and a diode package disposed between the cooling plates for the positive-electrode and negative-electrode sides, the diode package comprising: a unidirectionally conducting element for the positive-electrode side; a unidirectionally conducting element for the negative-electrode side having a cathode face joined to an anode face of the unidirectionally conducting element for the positive-electrode side by interposing an AC input terminal therebetween; a base for the positive-electrode side formed of a metallic plate and joined to a cathode face of the unidirectionally conducting element for the positive-electrode side; a base for the negative-electrode side formed of a metallic plate and joined to an anode face of the unidirectionally conducting element for the negative-electrode side; and an insulating resin provided so that the unidirectionally conducting elements for the positive-electrode and negative-electrode sides are embedded therein, at least end faces of the respective bases for the positive-electrode and negative-electrode sides are exposed therefrom on both sides in the depositing direction of the unidirectionally conducting elements for the positive-electrode and negative-electrode sides, and the top end of the AC input terminal extends therefrom, wherein in the diode package, the end face of the base for the positive-electrode side is joined to the principal plane of the cooling plate for the positive-electrode side while the end face of the base for the negative-electrode side is joined to the principal plane of the cooling plate for the negative-electrode side.

Preferably, in the diode package, any one of 3n sets and 4n sets of the unidirectionally conducting elements for the positive-electrode and negative-electrode sides, each set of the unidirectionally conducting elements for the positive-electrode and negative-electrode sides constituted by depositing the unidirectionally conducting elements for the positive-electrode and negative-electrode sides in one piece by interposing the AC input terminal therebetween, is aligned, cathode faces of the unidirectionally conducting elements for the positive-electrode side constituting any one of 3n sets and 4n sets of the unidirectionally conducting elements for the positive-electrode and negative-electrode sides are joined to the one base for the positive-electrode side extending in the aligning direction while anode faces of the unidirectionally conducting elements for the negative-electrode side constituting any one of 3n sets and 4n sets of the unidirectionally conducting elements for the positive-electrode and negative-electrode sides are joined to the one base for the negative-electrode side extending in the aligning direction, and any one of 3n sets and 4n sets of the unidirectionally conducting elements for the positive-electrode and negative-electrode sides are embedded in the insulating resin.

The unidirectionally conducting elements for the positive-electrode and negative-electrode sides may be respectively formed of a mesa-type diffusion element made by p-n junction of a p-semiconductor and an n-semiconductor using n-silicon.

Preferably, the face of the base for the positive-electrode side to be joined to the unidirectionally conducting element for the positive-electrode side has the same area as or a larger area than a cathode face area of the unidirectionally conducting element for the positive-electrode side while the face of the base for the negative-electrode side to be joined to the unidirectionally conducting element for the negative-electrode side has the same area as or a larger area than an anode face area of the unidirectionally conducting element for the negative-electrode side, and wherein furthermore the faces of the AC input terminal to be interposed between the unidirectionally conducting elements for the positive-electrode and negative-electrode sides respectively have the same areas as or larger areas than the anode face area of the unidirectionally conducting element for the positive-electrode side and the cathode face area of the unidirectionally conducting element for the negative-electrode side.

Preferably, the junction area between the base for the positive-electrode side and the cooling plate for the positive-electrode side is the same as or larger than the junction area between the base for the positive-electrode side and the unidirectionally conducting element for the positive-electrode side while the junction area between the base for the negative-electrode side and the cooling plate for the negative-electrode side is the same as or larger than the junction area between the base for the negative-electrode side and the unidirectionally conducting element for the negative-electrode side.

The AC input terminal may preferably have a joint structure.

The portion of the AC input terminal extending from the insulating resin may preferably have a bent structure.

The bases for the positive-electrode and negative-electrode sides may respectively soldered to the cooling plates for the positive-electrode and negative-electrode sides.

Preferably, the bases for the positive-electrode and negative-electrode sides are respectively made from a copper material while respective junction faces of the bases for the positive-electrode and negative-electrode sides to the cooling plates for the positive-electrode and negative-electrode sides are nickel-plated.

Preferably, at least one of the junction between the base for the positive-electrode side and the cooling plate for the positive-electrode side and the junction between the base for the negative-electrode side and the cooling plate for the negative-electrode side is performed by press-fitting.

Preferably, the base to be press-fitted extends from the insulating resin in the direction orthogonal to the depositing direction of the unidirectionally conducting elements for the positive-electrode and negative-electrode sides and the extending portion of the base has an external peripheral side knurled thereon.

Preferably, heat-radiation fins are provided in an end face of either of the bases for the positive-electrode and negative-electrode sides.

Preferably, the ventilating means is composed of a fan, and in the diode package, the central point of the unidirectionally conducting elements for the positive-electrode and negative-electrode sides which are deposited in one piece is arranged to be positioned in the outer diameter side further than the central point of fan blades with respect to the shaft.

Preferably, the cooling plates for the positive-electrode and negative-electrode sides extend inwardly in the radial direction with respect to the shaft, and a large number of ventilating holes are formed in the extending portions of the cooling plates so as to penetrate the extending portion in parallel with the shaft.

Preferably, in the diode package, the AC input terminal is radially outwardly oriented with respect to the shaft, and an air intake opening is formed in a portion of the case opposing to the AC input terminal.

The insulating resin may preferably contain particles of an inorganic calcined product.

DESCRIPTION OF THE PREFERRED EMBODIMENTS

Embodiments of the present invention will be described below with reference to the drawings.

First Embodiment

Figure 1:
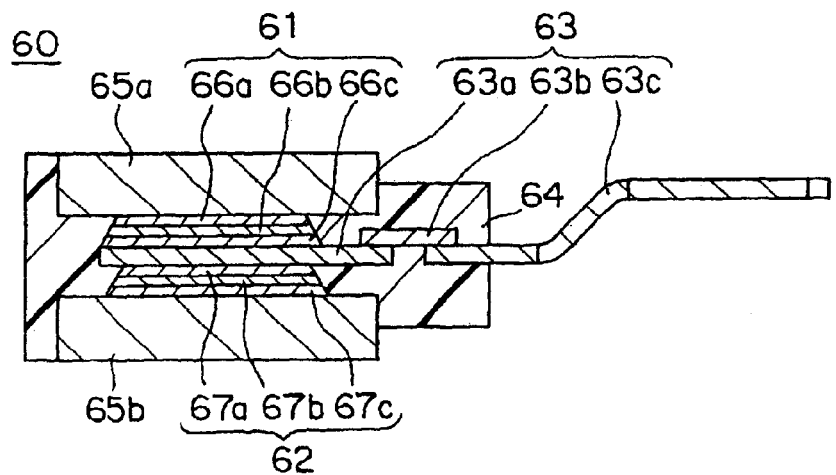
FIG. 1 is a sectional view showing the structure of a diode package forming a rectifier unit of a vehicle AC generator according to a first embodiment of the present invention.
Figure 2:
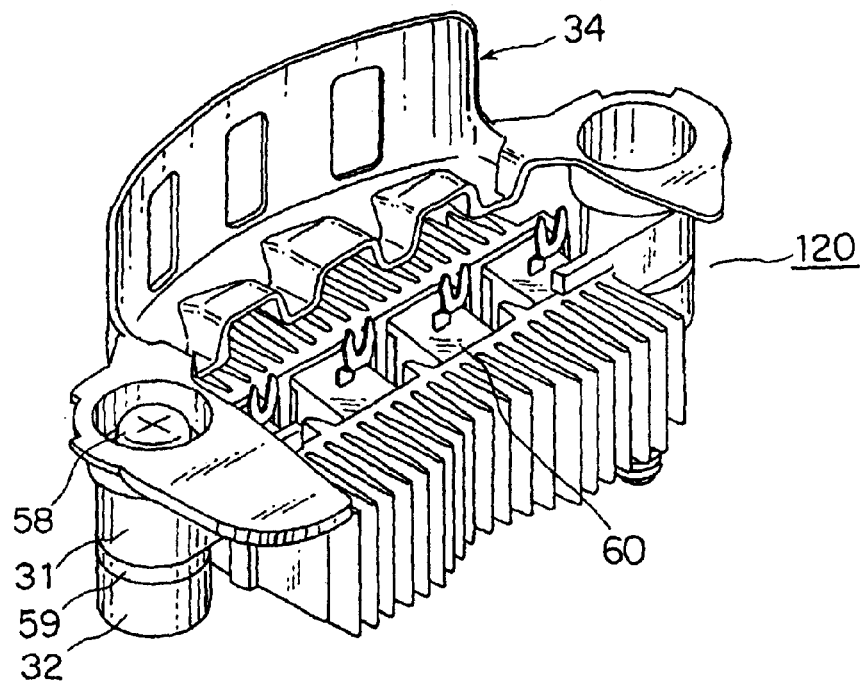
FIG. 2 is a perspective view of the rectifier unit equipped in the vehicle AC generator according to the first embodiment of the present invention.
Figure 3:
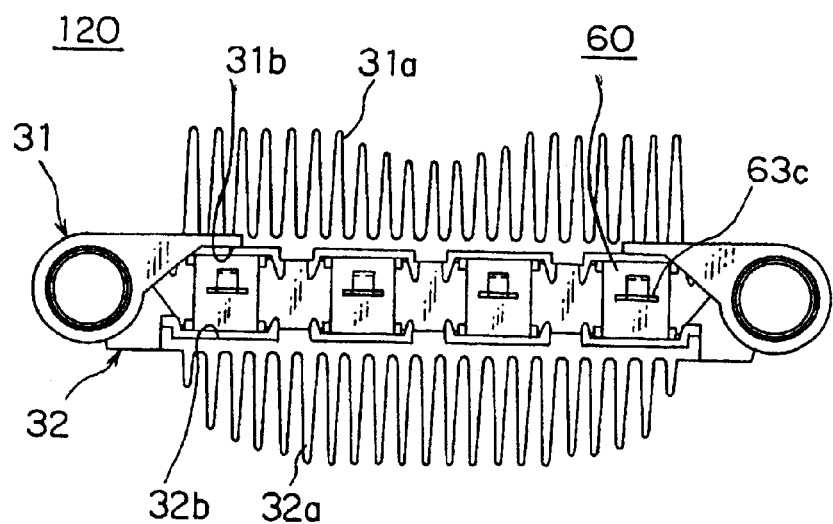
FIG. 3 is a bottom plan view of the rectifier unit equipped in the vehicle AC generator according to the first embodiment of the present invention.
Figure 4:
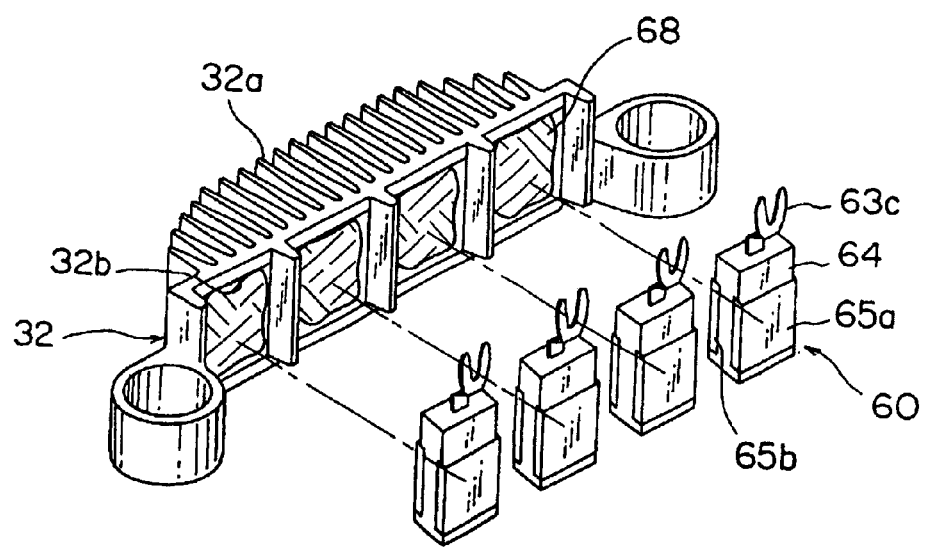
FIG. 4 is a perspective view for showing a joining method of the diode package in the rectifier unit equipped in the vehicle AC generator according to the first embodiment of the present invention.
Figure 5:
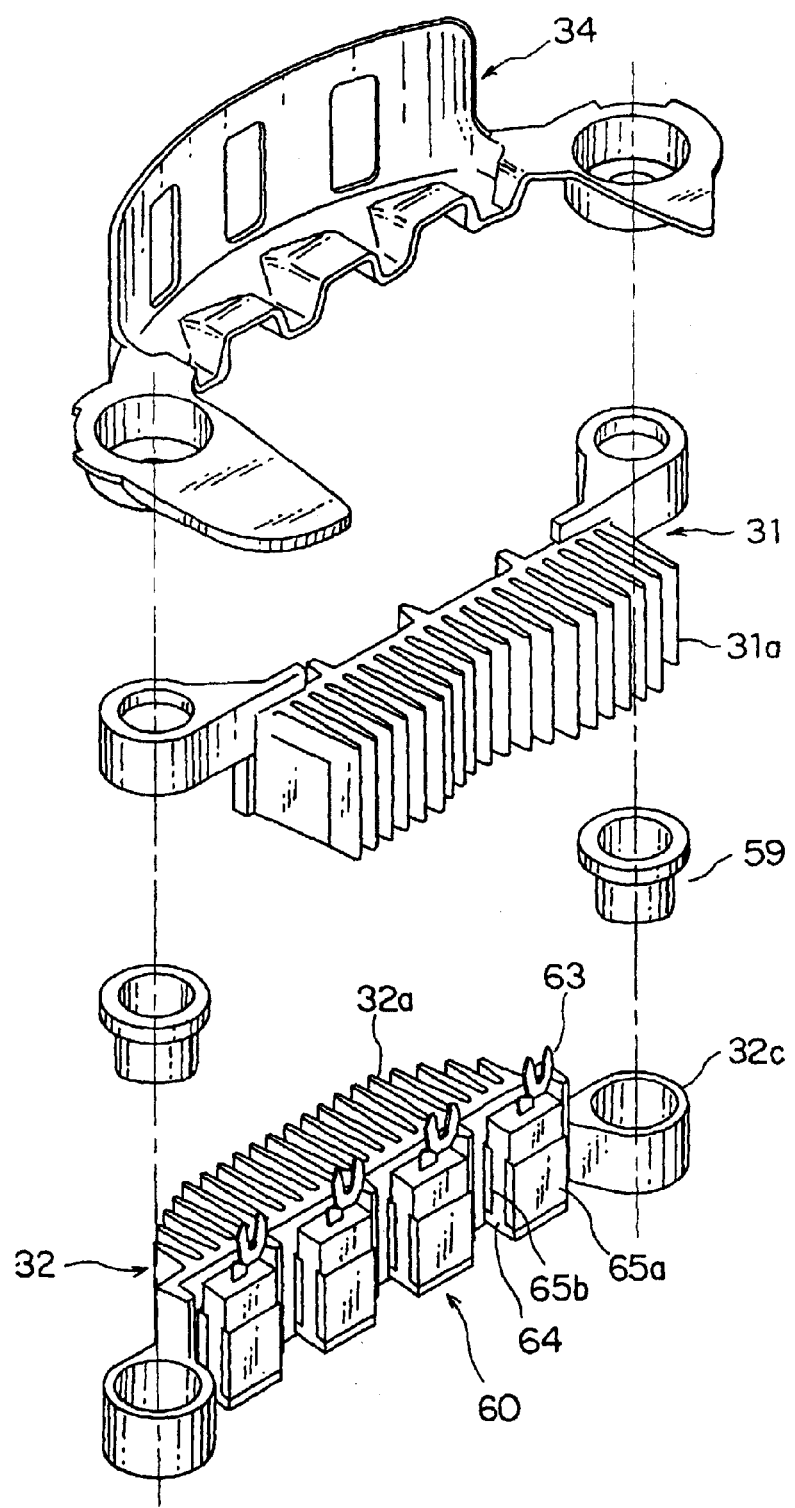
FIG. 5 is an assembly view of the rectifier unit equipped in the vehicle AC generator according to the first embodiment of the present invention.
Figure 6:
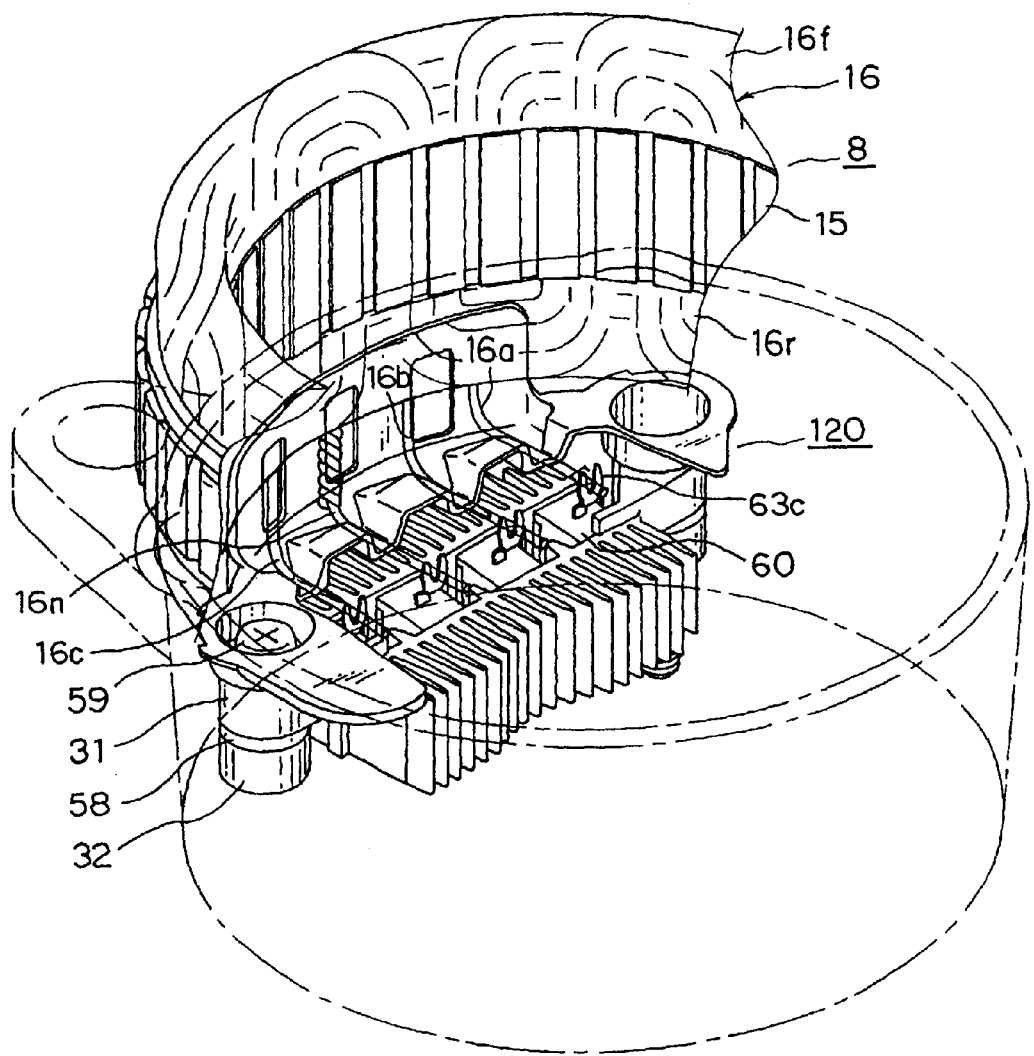
FIG. 6 is a perspective view for showing an assembled state of a stator and the rectifier unit according to the first embodiment of the present invention.
Figure 7:
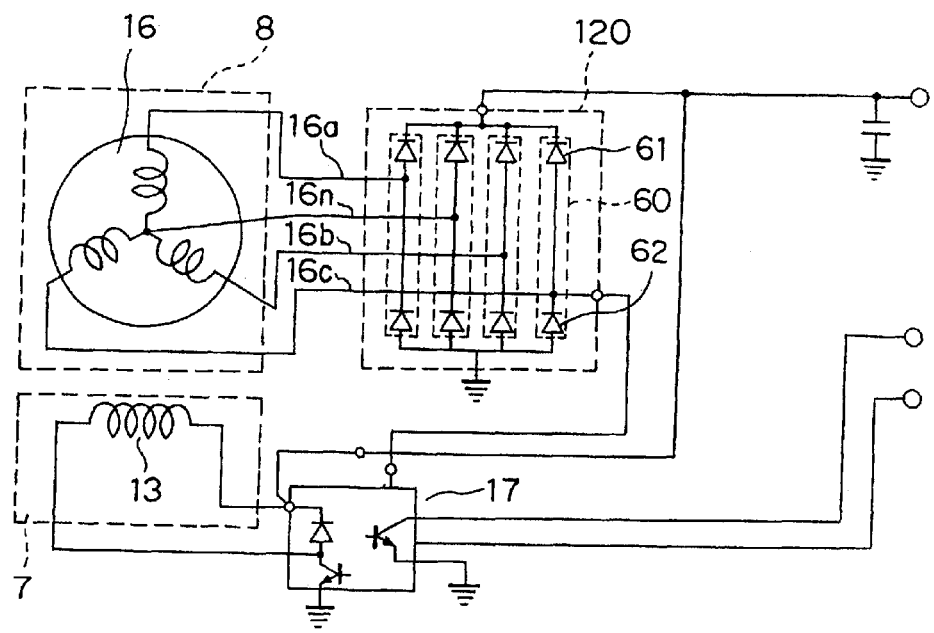
FIG. 7 is a circuit diagram of the vehicle AC generator according to the first embodiment of the present invention.

FIG. 1 is a sectional view showing the structure of a diode package forming a rectifier unit of a vehicle AC generator according to a first embodiment of the present invention; FIG. 2 is a perspective view of the rectifier unit equipped in the vehicle AC generator according to the first embodiment of the present invention; FIG. 3 is a bottom plan view of the rectifier unit equipped in the vehicle AC generator according to the first embodiment of the present invention; FIG. 4 is a perspective view for showing a joining method of the diode package in the rectifier unit equipped in the vehicle AC generator according to the first embodiment of the present invention; FIG. 5 is an assembly view of the rectifier unit equipped in the vehicle AC generator according to the first embodiment of the present invention; FIG. 6 is a perspective view for showing an assembled state of a stator and the rectifier unit according to the first embodiment of the present invention; and FIG. 7 is a circuit diagram of the vehicle AC generator according to the first embodiment of the present invention.

In addition, in the above drawings, like reference characters designate like portions having functions common or equivalent to those of conventional apparatuses shown in FIGS. 21 to 35, and description thereof is omitted.

Referring now to FIG. 1, the structure of the diode package forming the rectifier unit will be described.

In a diode package 60, a unidirectionally conducting element 61 for the positive-electrode side formed on a base 65*a* for the positive-electrode side formed of a substantially rectangular parallelepiped metallic plate and a unidirectionally conducting element 62 for the negative-electrode side formed on a base 65*b* for the negative-electrode side formed of a substantially rectangular parallelepiped metallic plate are deposited in one piece interposing an AC input terminal 63 therebetween, and are sealed with an insulating resin 64 so as to have the shape of a substantially rectangular parallelepiped.

The unidirectionally conducting element 61 for the positive electrode side is a diffusion type semiconductor element using n-type silicon 66*b* as a p-n junction, formed by joining of an n-type semiconductor 66*a* to a p-type semiconductor 66*c*, wherein the substantially truncated conical n-type semiconductor 66*a*, the n-type silicon 66*b*, and the p-type semiconductor 66*c* are formed on the base 65*a* for the positive-electrode side by stacking, in order from the base side, the n-type semiconductor 66*a*, the n-type silicon 66*b*, and the p-type semiconductor 66*c*. On the other hand, the unidirectionally conducting element 62 for the negative-electrode side is a diffusion type semiconductor element using n-type silicon 67*b* as a p-n junction, formed by joining of an n-type semiconductor 67*a* to a p-type semiconductor 67*c*, wherein the substantially truncated conical n-type semiconductor 67*a*, the n-type silicon 67*b*, and the p-type semiconductor 67*c* are formed on the base 65*b* for the negative-electrode side by stacking, in order from the base side, the p-type semiconductor 67*c*, the n-type silicon 67*b*, and the n-type semiconductor 67*a*. The unidirectionally conducting element 61 for the positive-electrode side and the unidirectionally conducting element 62 for the negative-electrode side are deposited in one piece by placing the p-type semiconductor 66*c* and the n-type semiconductor 67*a* so as to oppose each other via the AC input terminal 63. At least end faces of the base 65*a* for the positive-electrode side and the base 65*b* for the negative-electrode side are exposed from the insulating resin 64 on both sides in the depositing direction of the unidirectionally conducting element 61 for the positive electrode side, the AC input terminal 63, and the unidirectionally conducting element 62 for the negative-electrode side.

The base 65*a* for the positive electrode side and the base 65*b* for the negative-electrode side are made from copper and the surfaces thereof, which are exposed from the insulating resin 64, are nickel-plated so as to form junction faces to a cooling plate for the positive electrode side and a cooling plate for the negative-electrode side. Both faces of the base 65*a* for the positive electrode side, which are joined to the unidirectionaly conducting element 61 for the positive electrode side and the cooling plate 31 for the positive electrode side, are respectively formed to have a larger area than the bottom area of the unidirectionally conducting element 61 for the positive electrode side. Similarly, both faces of the base 65*b* for the negative-electrode side, which are joined to the unidirectionally conducting element 62 for the negative-electrode side and the cooling plate 32 for the negative-electrode side, are respectively formed to have a larger area than the bottom area of the unidirectionally conducting element 62 for the negative-electrode side.

The AC input terminal 63 is formed of a tab 63*a* interposed between the p-type semiconductor 66*c* of the unidirectionally conducting element 61 for the positive electrode side and the n-type semiconductor 67*a* of the unidirectionally conducting element 62 for the negative-electrode side, a bent connecting lead 63*c*, and an internal lead 63*b* for connecting the tab 63*a* to the connecting lead 63*c*. The tab 63*a*, the internal lead 63*b*, and the connecting lead 63*c* are respectively made from copper and are soldered to each other, wherein the connecting lead 63*c* extends from the insulating resin 64 in the direction orthogonal to the depositing direction of the unidirectionally conducting elements 61 and 62 for the positive- and negative-electrode sides. Both faces of the tab 63*a*, which are to be joined to the p-type semiconductor 66*c* of the unidirectionally conducting element 61 for the positive electrode side and the n-type semiconductor 67*a* of the unidirectionally conducting element 62 for the negative-electrode side, are respectively formed to have a lager area than respective bottom areas of the p-type semiconductor 66*c* and the n-type semiconductor 67*a*.

As the insulating resin 64, an epoxy resin containing particles of an inorganic calcined product such as $Al_2O_3$, SiC, or $SiO_2$ is used.

As described above, the diode package 60 is formed by molding of a pair of the unidirectionally conducting elements 61 and 62 for the positive- and negative-electrode sides with the insulating resin 64.

Then a rectifier unit will be described with reference to FIGS. 2 to 5.

As shown in FIG. 2, a rectifier unit 120 comprises four of the diode packages 60, cooling plates 31 and 32 for the positive- and negative-electrode sides which support the diode packages 60, an insulating mold 59 for securing insulation between the cooling plates 31 and 32 for the positive- and negative-electrode sides, and a partition plate 34.

The cooling plate 31 for the positive-electrode side is made from aluminum and has four rectangular concave portions 31*b* formed on its principal plane at equal intervals and a plurality of straight heat-radiation fins 31*a* formed on its plane opposite to the principal plane. At least the surfaces of the concave portions 31*b* are nickel-plated. Similarly, the cooling plate 32 for the negative-electrode side is made from aluminum and has four rectangular concave portions 32*b* formed on its principal plane at equal intervals and a plurality of straight heat-radiation fins 32*a* formed on its plane opposite to the principal plane. At least the surfaces of the concave portions 32*b* are nickel-plated.

In order to assemble the rectifier unit 120, as shown in FIG. 4, a solder layer 68 of a binary eutectic alloy of 95% Pb—5% Sn is firstly formed on each concave portion 32*b* of the cooling plate 32 for the negative-electrode side; the diode package 60 is placed on each concave portion 32*b* so that the base 65*b* for the negative-electrode side touches the solder layer 68; the cooling plate 32 for the negative-electrode side is heated so as to melt the solder layer 68 while pushing the diode package 60 against the cooling plate 32; and then the melted solder layer 68 is cured, and thereby the diode package 60 is soldered to the cooling plate 32 for the negative-electrode side.

Next, as shown in FIG. 5, the insulating mold 59 is press-fitted to a flange 32*c* of the cooling plate 32 for the negative-electrode side; a solder layer of 100% Sn (not shown) is formed on each concave portion 31*b* of the cooling plate 31 for the positive-electrode side; the cooling plate 31 for the positive-electrode side is placed so that the solder layer of 100% Sn abuts the base 65*a* for the positive-electrode side of each diode package 60; the cooling plate 31 for the positive-electrode side is heated so as to melt the solder layer of 100% Sn; and then the melted solder layer is cured, and thereby the diode package 60 is soldered to the cooling plate 31 for the positive-electrode side. At this time, since the solder layer 68 of a binary eutectic alloy of 95% Pb—5% Sn has a solidus line temperature of 300° C. while the solder layer of 100% Sn has a melting point of 232° C., the solder layer 68 joining the diode package 60 to the cooling plate 32 for the negative-electrode side is prevented from melting during the joining of the diode package 60 and the cooling plate 31 for the positive-electrode side.

Thereby, as shown in FIG. 3, the rectifier unit 120 is assembled, wherein four diode packages 60 are held between a pair of the cooling plates 31 and 32 for the positive- and negative-electrode sides. As shown in FIG. 2, the rectifier unit 120 is tightened and fixed to a rear bracket (not shown) together with the partition plate 34 with joining screws 58. At this time, the cooling plate 32 for the negative-electrode side is electrically connected to the rear bracket and the base 65b for the negative-electrode side is grounded.

As shown in FIG. 6, in the rectifier unit 120 formed as above, the connecting lead 63c of each diode package 60 is respectively connected to the leads 16a to 16c and 16n of the stator coil 16. Thereby, the circuit shown in FIG. 7 is formed so that the three-phase AC voltage that is output from each output terminal of the stator coil 16 is rectified in the full-wave by the rectifier unit 120. Also, a ripple current is output by the rectifier unit 120 via, the neutral point of the stator coil 16 so as to improve the output current.

Figure 21:
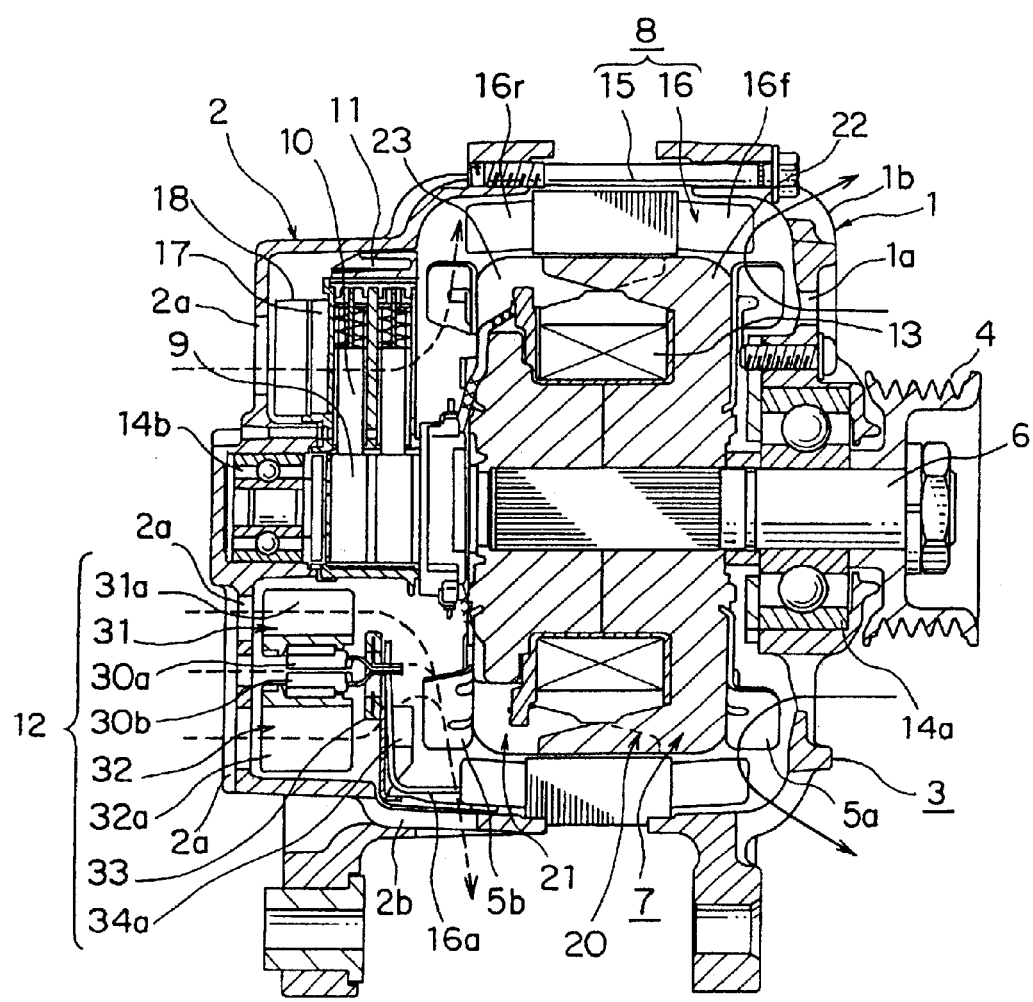
FIG. 21 a sectional view showing a structure of a conventional vehicle AC generator.
Figure 22:
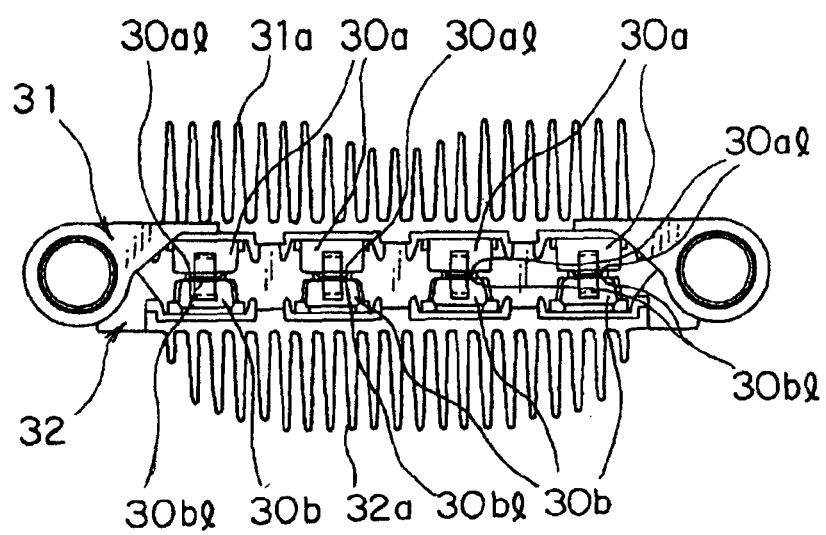
FIG. 22 is a bottom plan view of a rectifier unit equipped in the conventional vehicle AC generator.
Figure 23:
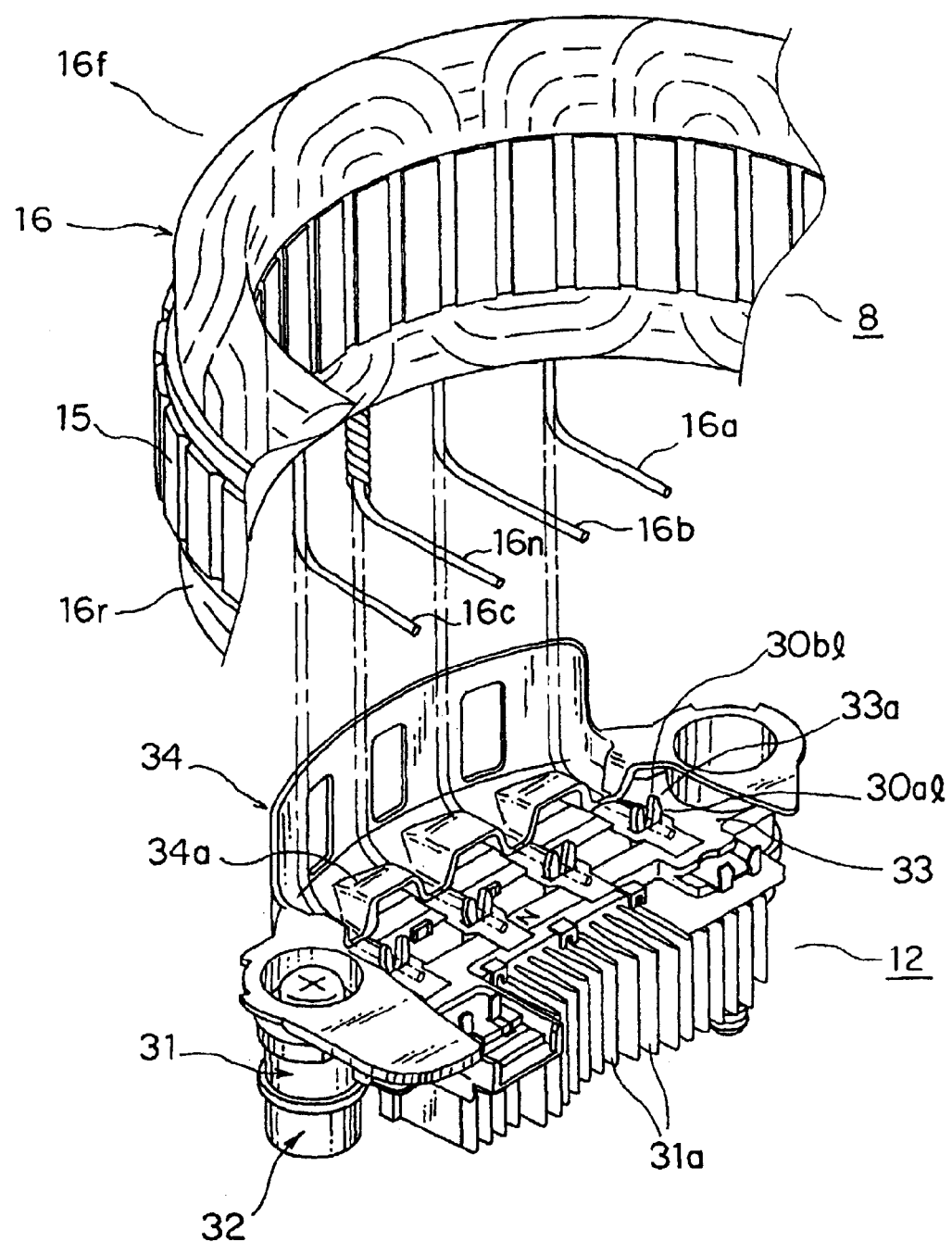
FIG. 23 is a drawing for showing an assembling procedure of a stator and the rectifier unit in the conventional vehicle AC generator.
Figure 24:
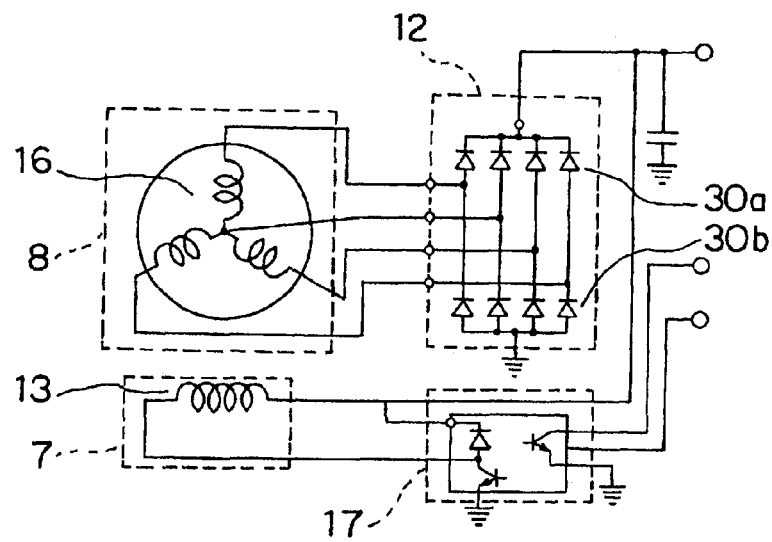
FIG. 24 is a circuit diagram showing an example of circuit diagrams of the conventional vehicle AC generator.
Figure 25:
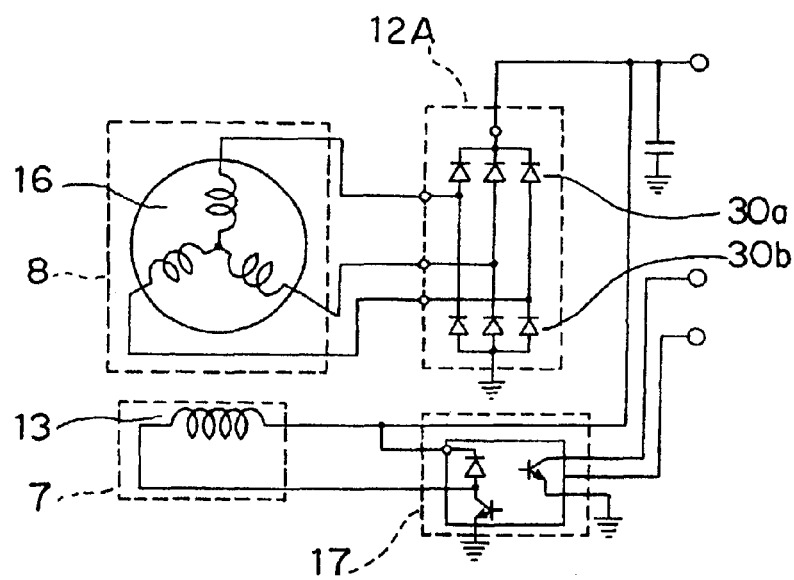
FIG. 25 is a circuit diagram showing another example of circuit diagrams of the conventional vehicle AC generator.
Figure 26:
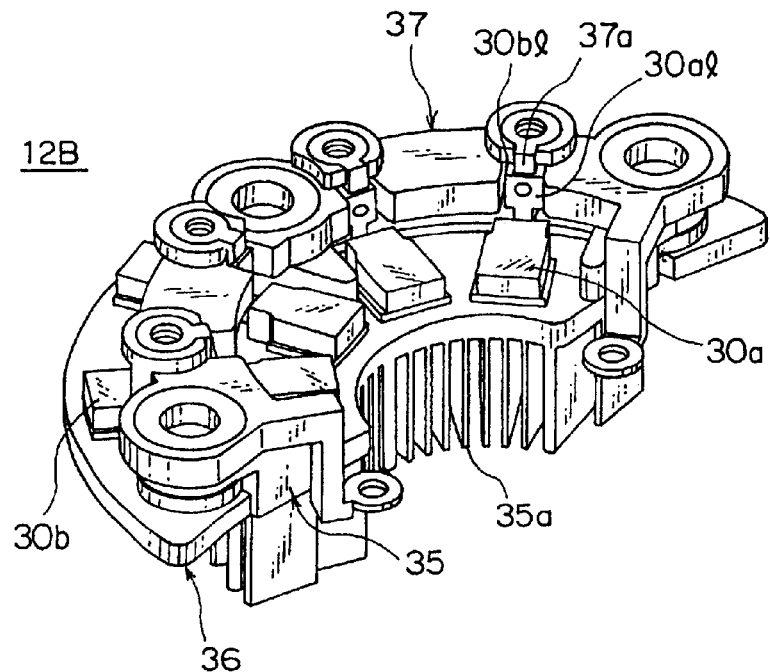
FIG. 26 is a perspective view of another conventional rectifier unit.
Figure 27:
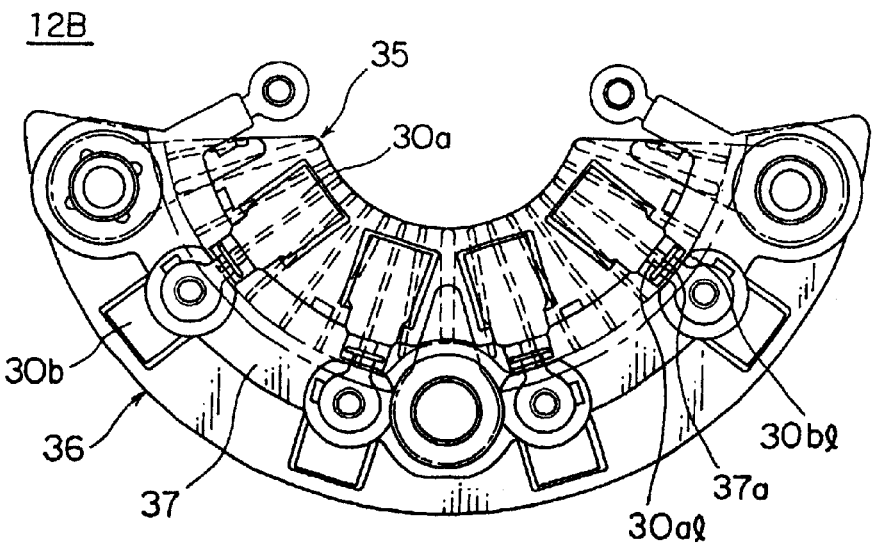
FIG. 27 is a front view of the other conventional rectifier unit.
Figure 28:
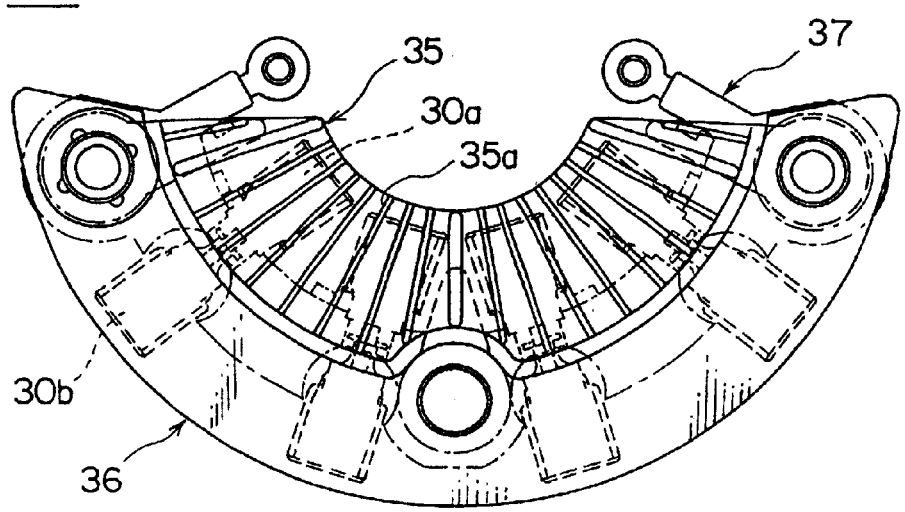
FIG. 28 is a rear elevational view of the other conventional rectifier unit.
Figure 29:
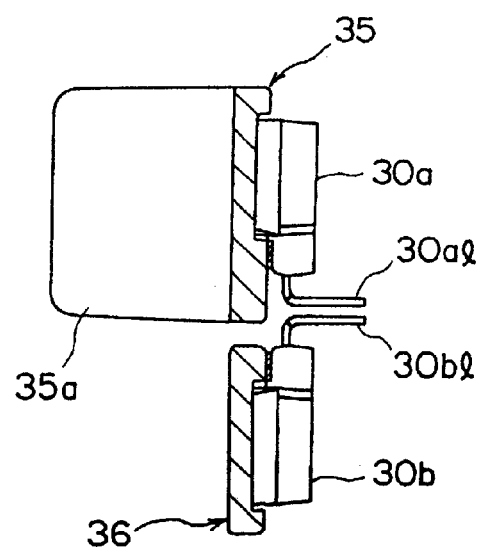
FIG. 29 is an essential part sectional view showing a structure of the other conventional rectifier unit.
Figure 30:
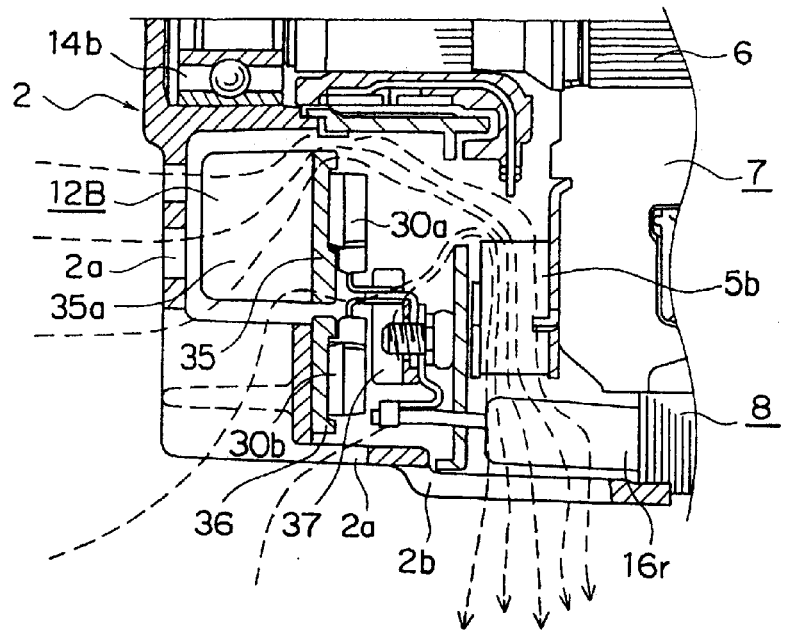
FIG. 30 is an essential part sectional view showing the flow of cooling air in a vehicle AC generator equipping with the other conventional rectifier unit.
Figure 31:
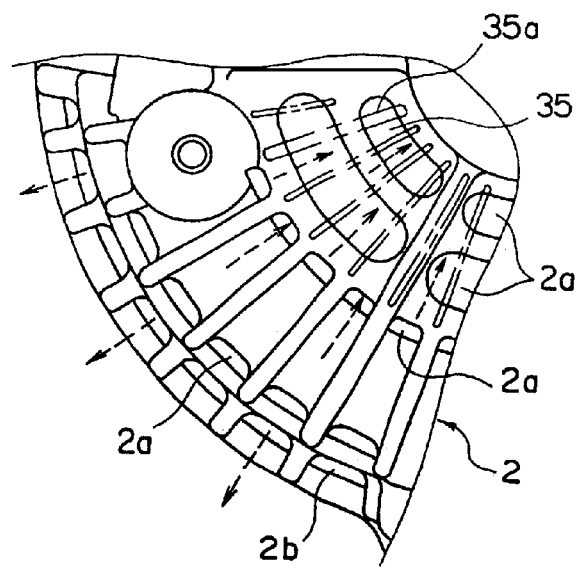
FIG. 31 is an essential part front view showing the flow of cooling air in the vehicle AC generator equipping with the other conventional rectifier unit.
Figure 32:
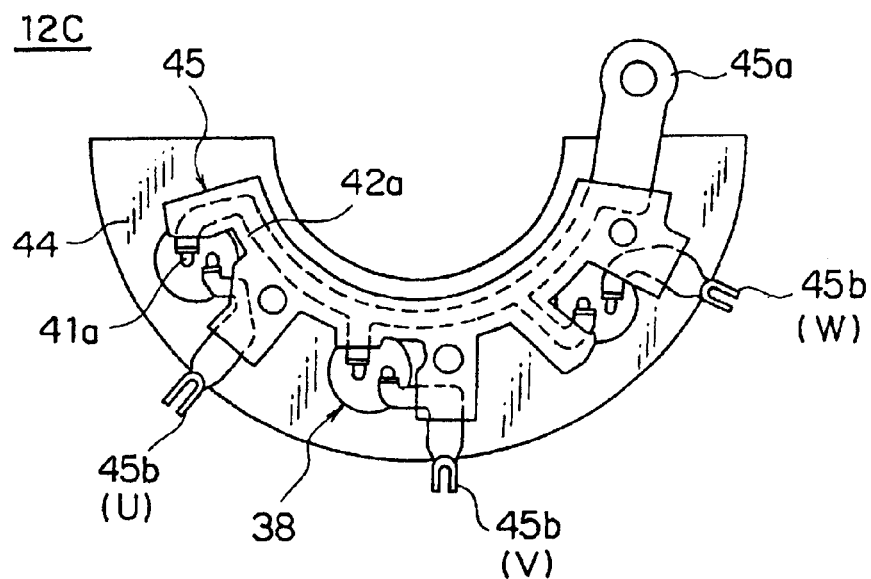
FIG. 32 is a front view of still another conventional rectifier unit.
Figure 33:
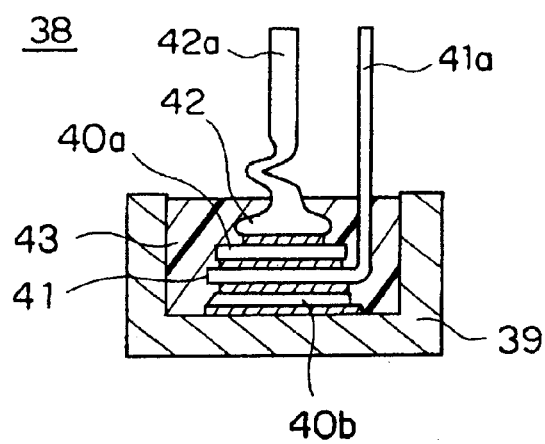
FIG. 33 is a sectional view of a rectifier element forming the still other conventional rectifier unit.
Figure 34:
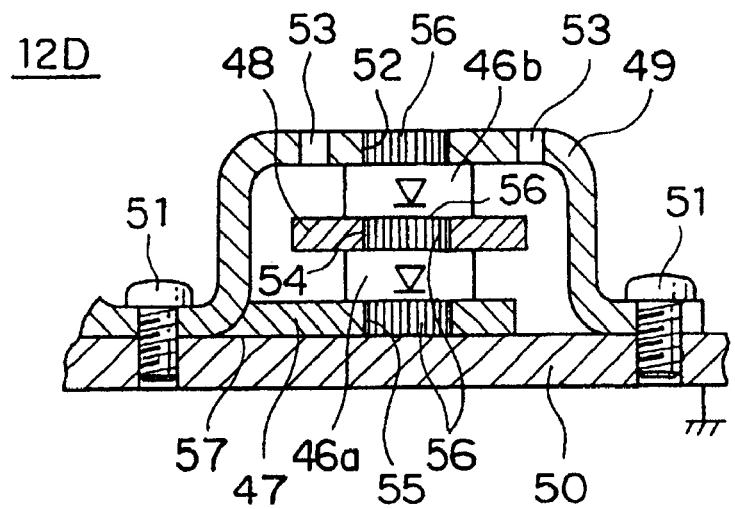
FIG. 34 is a sectional view of the other conventional rectifier unit.
Figure 35:
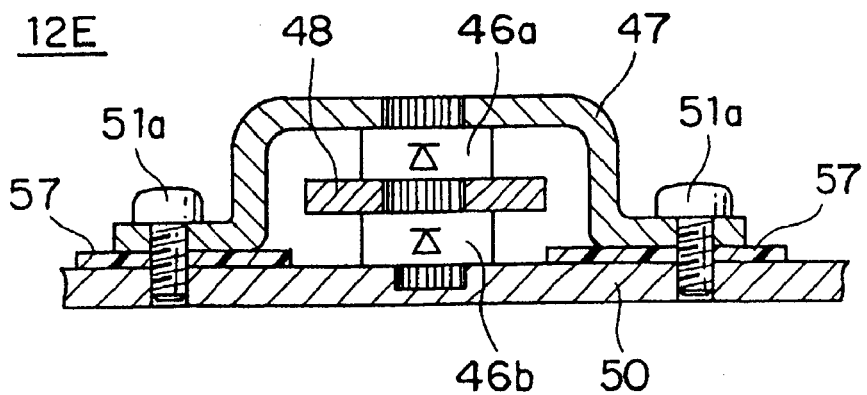
FIG. 35 is a sectional view of the still other conventional rectifier unit.

In addition, the rectifier unit 120 formed as above is equipped in the vehicle AC generator shown in FIG. 21 instead of the conventional rectifier unit 12 so as to be similarly operated.

According to the first embodiment, the diode package 60 forming the rectifier unit 120 is formed by depositing the unidirectionally conducting element 61 for the positive-electrode side and the unidirectionally conducting element 62 for the negative-electrode side in one piece via the tab 63a of the AC input terminal 63, wherein the cathode face of the unidirectionally conducting element 61 for the positive-electrode side is joined to the base 65a for the positive-electrode side formed of a metallic plate while the anode face of the unidirectionally conducting element 62 for the negative-electrode side is joined to the base 65b for the negative-electrode side formed of a metallic plate. The base 65a for the positive-electrode side is joined to the cooling plate 31 for the positive-electrode side while the base 65b for the negative-electrode side is joined to the cooling plate 32 for the negative-electrode side. Thereby, the heat generated in the unidirectionally conducting elements 61 and 62 for the positive-and negative-electrode sides as a rectifying loss is thermally conducted to the cooling plates 31 and 32 for the positive- and negative-electrode sides via the bases 65a and 65b for the positive- and negative-electrode sides, respectively, so as to be efficiently dissipated therefrom. Since one AC input terminal 63 is only needed per one phase, joining operations to the leads of the stator coil 16 are simplified while the number of parts is reduced, and thereby the rectifier unit 120 is miniaturized so as to miniaturize the vehicle AC generator.

Since both faces of the base 65a for the positive-electrode side, which are joined to the unidirectionally conducting element 61 for the positive-electrode side and the cooling plate 31 for the positive-electrode side, are respectively formed to have a larger area than the bottom area of the unidirectionally conducting element 61 for the positive electrode side, the heat generated in the unidirectionally conducting element 61 for the positive-electrode side is thermally conducted efficiently to the cooling plate 31 for the positive-electrode side via the base 65a for the positive-electrode side, and thereby temperature increase of the unidirectionally conducting element 61 for the positive-electrode side is restrained.

Also, since both faces of the base 65b for the negative electrode side, which are joined to the unidirectionally conducting element 62 for the negative-electrode side and the cooling plate 32 for the negative-electrode side, are respectively formed to have a larger area than the bottom area of the unidirectionally conducting element 62 for the negative-electrode side, the heat generated in the unidirectionally conducting element 62 for the negative-electrode side is thermally conducted efficiently to the cooling plate 32 for the negative-electrode side via the base 65b for the negative-electrode side, and thereby temperature increase of the unidirectionally conducting element 62 for the negative-electrode side is restrained.

Since the bases 65a and 65b for the positive- and negative-electrode sides are respectively soldered to the cooling plates 31 and 32 for the positive- and negative-electrode sides, air is not interposed in the junction portions so that the heat generated in the unidirectionally conducting elements 61 and 62 for the positive- and negative-electrode sides is thermally conducted efficiently to the cooling plates 31 and 32 for the positive- and negative-electrode sides, respectively. Thereby, temperature increase of the unidirectionally conducting elements 61 and 62 for the positive- and negative-electrode sides is furthermore restrained.

Furthermore, since both faces of the tab 63a, which are to be joined to the unidirectionally conducting element 61 for the positive-electrode side and the unidirectionally conducting element 62 for the negative-electrode side, are respectively formed to have a lager area than respective bottom areas of the unidirectionally conducting element 61 for the positive-electrode side and the unidirectionally conducting element 62 for the negative-electrode side, the thermal resistance of the junction portions between the unidirectionally conducting element 61 for the positive-electrode side and the tab 63a and between the unidirectionally conducting element 62 for the negative-electrode side and the tab 63a is reduced. Therefore, a part of the heat generated in one of the unidirectionally conducting elements 61 (62) is thermally conducted to the other unidirectionally conducting element 62 (61) via the tab 63a so as to be rapidly dissipated from the cooling plate 32 (31). Thereby, even when the heating value of the unidirectionally conducting element 61 for the positive-electrode side is unbalanced with that of the unidirectionally conducting element 62 for the negative-electrode side, the heat of the unidirectionally conducting element having a larger heating value is dissipated from the cooling plate in the side of the unidirectionally conducting element having a smaller heating value, thereby temperature increase of the unidirectionally conducting element can be efficiently restrained.

Since the bases 65a and 65b for the positive- and negative-electrode sides are made from copper having high thermal conductivity, the heat of the unidirectionally conducting elements 61 and 62 for the positive- and negative-electrode sides is thermally conducted efficiently to the cooling plates 31 and 32 for the positive- and negative-electrode sides. Also, since junction faces of the bases 65a and 65b for the positive- and negative-electrode sides to the cooling plates 31 and 32 for the positive- and negative-electrode sides are nickel-plated, the surfaces of the junction portions of the bases 65a and 65b for the positive- and negative-electrode sides cannot be oxidized during the soldering approximately at a high temperature of 300° C., and thereby a large joining force by soldering is obtained while reduction of the joining force by till soldering with passage of time can be restrained so as to obtain high reliability. In addition, when a copper raw material is soldered, the surface thereof is oxidized approximately at a high temperature of 300° C., so that a sufficient joining force is not obtained while the joining force by soldering is reduced with passage of time so as not to secure sufficient reliability.

Since the concave portions 31a and 32a formed on the principal planes of the cooling plates 31 and 32 for the positive- and negative-electrode sides are formed to have a rectangular shape and the bases 65a and 65b for the positive- and negative-electrode sides are formed to have a rectangular parallelepiped, the diode package 60 is difficult to be rotated during the soldering on the principal planes of the cooling plates 31 and 32 for the positive- and negative-electrode sides, and thereby the extending direction of the AC input terminal 63 can be readily prescribed. That is, positional divergence between the connecting lead 63c of the AC input terminal 63 and the lead of the stator coil 16 can be restrained so that joining of the both can be easily performed.

The semiconductors forming the unidirectionally conducting elements 61 and 62 have a mesa structure and are also of a diffusion type. Therefore, the backward surge voltage resistivity of the unidirectionally conducting element is large, so that the noise propagation to other vehicle electronic components such as radios and blowers can be prevented. The forward voltage resistivity is reduced, so that heat production by the element itself is reduced. Also, the unidirectionally conducting elements 61 and 62 for the positive- and negative-electrode sides have the same structure and the same shape, enabling the semiconductor element to be used in common.

Since the unidirectionally conducting elements 61 and 62 for the positive- and negative-electrode sides are sealed with the insulating resin 64, the insulation between the positive electrode and the negative electrode can be secured and foreign substances such as salt water and dust can also be prevented from entering within internal elements. Since the insulating resin 64 uses a resin material containing particles of an inorganic calcined product, the thermal conductivity of the insulating resin 64 is increased, so that the heat of the unidirectionally conducting elements 61 and 62 for the positive- and negative-electrode sides is thermally conducted through the insulating resin 64 to be dissipated from the external surface of the insulating resin 64.

The heat-radiation fins 31a and 32a are provided in the cooling plates 31 and 32 for the positive- and negative-electrode sides, enabling thermal radiation from the cooling plates 31 and 32 to be improved.

The vibration generated by a vehicle is propagated to the stator and the rectifier unit. Since the stator and the rectifier unit have different transfer functions, modes, and natural properties of vibration, so that the both units do not vibrate in synchronization with each other, the vibration is propagated from the stator coil to the AC input terminal, which might damage the internal element (unidirectionally conducting element). In the rectifier unit 120, since the AC input terminal 63 has a joint structure comprising the tab 63a, the internal lead 63b, and the connecting lead 63c, the vibration transmission in the direction of the joint (the horizontal direction viewing FIG. 1) is relieved. Since the connecting lead 63c has a bent shape, the vibration transmission in the direction of the bending (the vertical direction viewing FIG. 1) is also relieved. Thereby, the vibration generated by a vehicle is difficult to be transferred to the internal element via the AC input terminal 63, enabling the damage of the internal element to be restrained.

Second Embodiment

Figure 8:
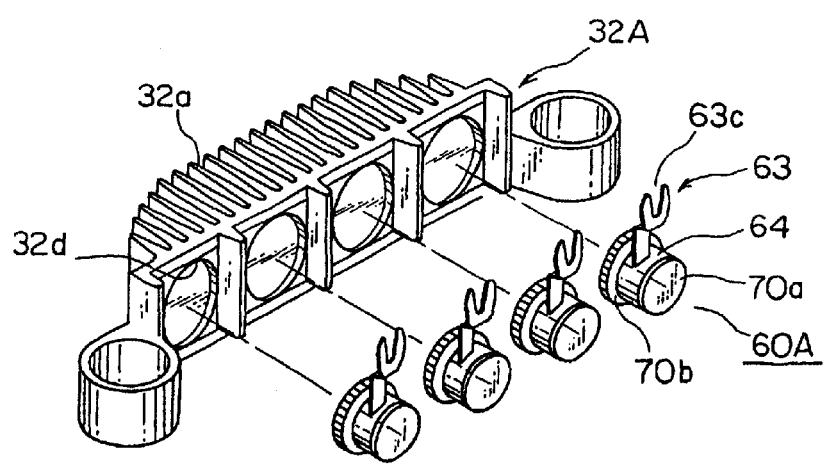
FIG. 8 is a perspective view for showing a joining method of a diode package in a rectifier unit equipped in a vehicle AC generator according to a second embodiment of the present invention.

FIG. 8 is a perspective view for showing a joining method of a diode package in a rectifier unit equipped in a vehicle AC generator according to a second embodiment of the present invention.

In FIG. 8, a diode package 60A is formed by depositing the unidirectionally conducting elements for the positive- and negative-electrode sides (not shown) in one piece via the tab of the AC input terminal 63, wherein a base 70a for the positive-electrode side is formed to have a disc shape; a base 70b for the negative-electrode side is formed to have a disc shape having a larger diameter than that of the base 70a; and the unidirectionally conducting elements for the positive- and negative-electrode sides, the AC input terminal 63, and the bases 70a and 70b for the positive- and negative-electrode sides are sealed with the insulating resin 64. The insulating resin 64 is formed to have a cylindrical shape having the same diameter as that of the base 70a for the positive-electrode side, and the base 70a for the positive-electrode side is exposed except the face in the joining side to the unidirectionally conducting element for the positive-electrode side. The base 70b for the negative-electrode side is exposed except the central portion of the face in the joining side to the unidirectionally conducting element for the negative-electrode side, and has a knurled peripheral surface. A cooling plate 32A for the negative-electrode side has four circular concave portions 32d formed thereon at predetermined intervals.

In addition, the other configurations are the same as those in the first embodiment.

In the second embodiment, the diode package 60A is attached to the cooling plate 32A for the negative-electrode side by press-fitting the base 70b for the negative-electrode side into each of the concave portions 32d. At this time, since in the base 70b for the negative-electrode side, the external peripheral edge toward the joining face to the unidirectionally conducting element for the negative-electrode side is exposed from the insulating resin 64, the base 70b is press-fitted into the concave portion 32d by pressing a press-fitting jig to the external peripheral edge of the base 70b, which is exposed from the insulating resin 64. Then the base 70a for the positive-electrode side of each diode package 60A attached to the cooling plate 32A for the negative-electrode side is soldered to a cooling plate for the positive-electrode side so as to obtain the rectifier unit.

In addition, a boss may be formed at the opposing position to the connecting lead 63c in the side of the base 70b for the negative-electrode side, and a key way to be engaged to the boss may be formed in the concave portion 32d, so that the rotation of the diode package 60A may be restrained by bringing the boss into engagement with the key way during the press-fitting of the diode package 60A into the concave portion 32d. Thereby, the position of the AC input terminal 63 can be prescribed, so that positional divergence between the connecting lead 63c and the lead of the stator coil 16 can be restrained, enabling joining of the both to be easily performed.

According to the second embodiment, the base 70b for the negative-electrode side is press-fitted into the concave portion 32d of the cooling plate 32A for the negative-electrode side, so that soldering is only needed for between the base 70a for the positive-electrode side and the cooling plate for the positive-electrode side, resulting in improved efficiency of assembly operations. Also, the required solder material is one kind such as Sn, so that when using solder of Sn, soldering is performed approximately at a low temperature of 232° C., eliminating oxidation on the soldering surface so as to obtain a large junction force by soldering. In this case, the nickel plating on the base made from copper is omitted, resulting in reduced cost.

The base 70b for the negative-electrode side is formed so as to be exposed from the insulating resin 64 except the central portion of the face in the joining side to the unidirectionally conducting element for the negative-electrode side, so that the base 70b can be press-fitted into the concave portion 32d by pressing the external peripheral edge of the base 70b, which is exposed from the insulating resin 64, of the joining face to the unidirectionally conducting element for the negative-electrode side. Thereby, the compression load during the press-fitting is not applied to the internal element (unidirectionally conducting element), preventing the damage of the element during the press-fitting.

In addition, in the second embodiment, the base 70b for the negative-electrode side is formed to have a disc shape having a large diameter and a knurled peripheral surface, and it is press-fitted into the concave portion 32d of the cooling plate 32A for the negative-electrode side; however the base for the positive-electrode side may be formed to have a disc shape-having a large diameter and a knurled peripheral surface, and it may be press-fitted into the concave portion of the cooling plate for the positive-electrode side so as to have the similar effect.

Third Embodiment

Figure 9:
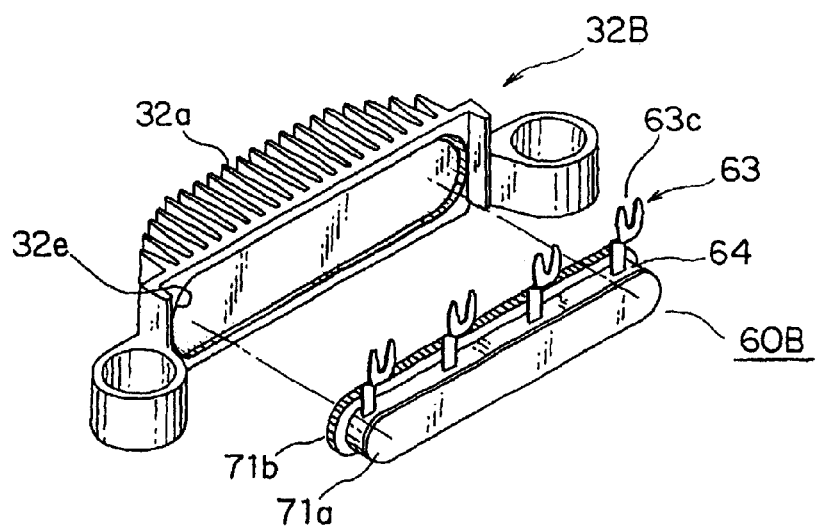
FIG. 9 is a perspective view for showing a joining method of a diode package in a rectifier unit equipped in a vehicle AC generator according to a third embodiment of the present invention.

FIG. 9 is a perspective view for showing a joining method of a diode package in a rectifier unit equipped in a vehicle AC generator according to a third embodiment of the present invention.

In FIG. 9, a base 71a for the positive-electrode side is formed to have a racetrack shape while a base 71b for the negative-electrode side is formed to have a racetrack shape having a larger diameter than that of the base 71a for the positive-electrode side. To form a diode package 60B, four pairs of the unidirectionally conducting elements for the positive- and negative-electrode sides deposited in one piece interposing the tab of the AC input terminal 63 therebetween are aligned between bases 71a and 71b for the positive- and negative-electrode sides and the insulating resin 64 is provided between the bases 71a and 71b for the positive- and negative-electrode sides so as to seal the four pairs of the unidirectionally conducting elements. The insulating resin 64 is formed to have a racetrack cylindrical shape having the same diameter as that of the base 71a for the positive-electrode side. The base 71a for the positive-electrode side is exposed except the face in the joining side to the unidirectionally conducting element for the positive-electrode side. The base 71b for the negative-electrode side is exposed except the central portion of the face in the joining side to the unidirectionally conducting element for the negative-electrode side and has the peripheral surface knurled thereon. A cooling plate 32B for the negative-electrode side is provided with a concave portion 32e having a racetrack shape.

In addition, the other configurations are the same as those in the second embodiment.

According to the third embodiment, in the diode package GOB, the base 71b for the negative-electrode side is attached to the cooling plate 32B for the negative-electrode side by press-fitting it into the concave portion 32e. At this time, since in the base 71b for the negative-electrode side, the external peripheral edge toward the joining face to the unidirectionally conducting element for the negative-electrode side is exposed from the insulating resin 64, the base 71b is press-fitted into the concave portion 32e by pressing a press-fitting jig to the external peripheral edge of the base 71b, which is exposed from the insulating resin 64. Then the base 71a for the positive-electrode side of the diode package GOB attached to the cooling plate 32B for the negative-electrode side is soldered to a cooling plate for the positive-electrode side so as to obtain the rectifier unit.

According to the third embodiment, the diode package 60B is formed by combining four pairs of the unidirectionally conducting elements for the positive- and negative-electrode sides into one module, so that in addition to the effects in the second embodiment, the number of parts of the rectifier unit is extremely reduced so as to reduce the man-hour of assembly operations, resulting in improvement of efficiency of assembly operations.

Also, since the joining faces of the bases 71a and 71b for the positive- and negative-electrode sides to the cooling plates can be large, the heat generated in the unidirectionally conducting elements is thermally conducted to the cooling plates efficiently, and thereby securely restraining temperature increase of the unidirectionally conducting elements.

In addition, in the third embodiment, the base 71b for the negative-electrode side has a large-diameter racetrack shape having a peripheral face knurled thereon and is press-fitted into the concave portion 32e of the cooling plate 32B for the negative-electrode side; however the base for the positive-electrode side may have a large-diameter racetrack shape having a peripheral face knurled thereon and may be press-fitted into a concave portion of the cooling plate for the positive-electrode side, resulting in obtaining the similar effect.

Fourth Embodiment

Figure 10:
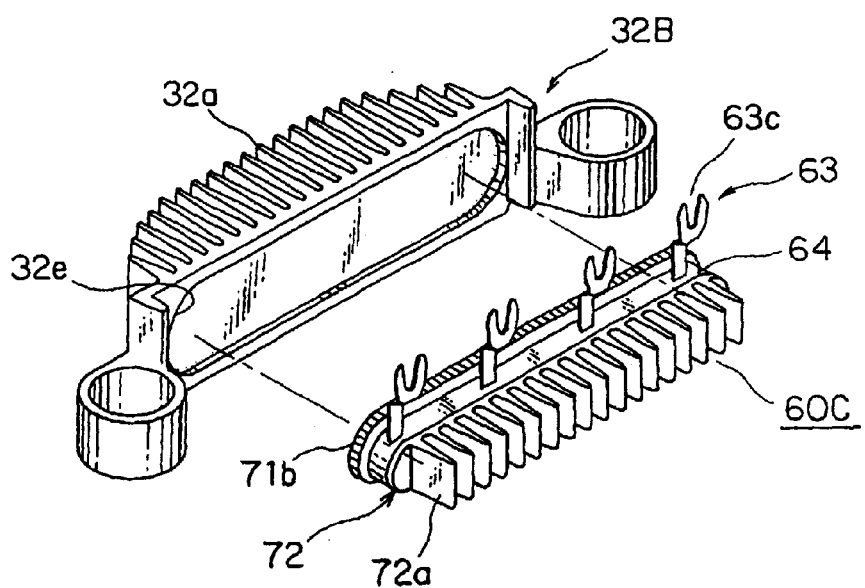
FIG. 10 is a perspective view for showing a joining method of a diode package in a rectifier unit equipped in a vehicle AC generator according to a fourth embodiment of the present invention.

In a fourth embodiment, as shown in FIG. 10, a diode package 60C is provided with heat-radiation fins 72a formed on a plane opposite to the joining face of a base 72 for the positive-electrode side to the unidirectionally conducting element for the positive-electrode side.

In addition, the other configurations are the same as those in the third embodiment.

According to the fourth embodiment, since the base 72 for the positive-electrode side is provided with the heat-radiation fins 72a, a cooling plate for the positive-electrode side is not required, so that the number of parts is furthermore reduced while soldering between the base 72 for the positive-electrode side and the cooling plate for the positive-electrode side is not required, and thereby extremely improving efficiency of assembly operations.

In addition, in the fourth embodiment, the base 72 for the positive-electrode side is provided with the heat-radiation fins 72a; however, the heat-radiation fins 72a may be provided in the base for the negative-electrode side so as to obtain the similar effect.

Fifth Embodiment

Figure 11:
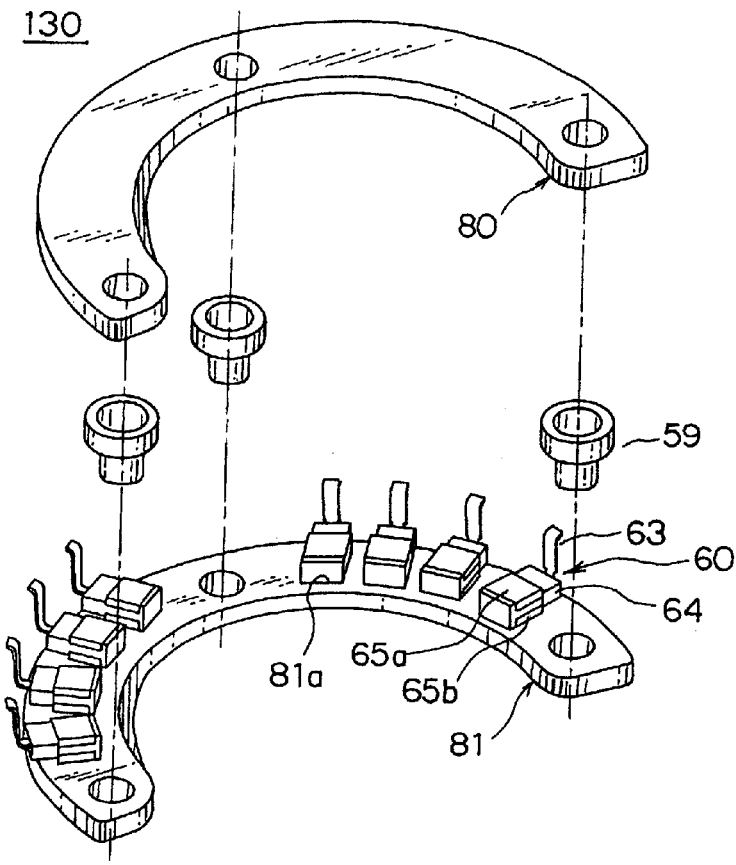
FIG. 11 is an assembly view of a rectifier unit equipped in a vehicle AC generator according to a fifth embodiment of the present invention.
Figure 12:
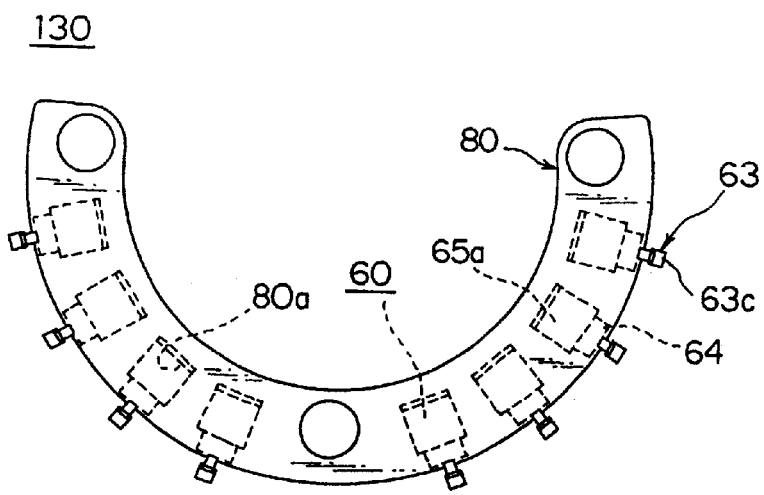
FIG. 12 is a top plan view of the rectifier unit equipped in the vehicle AC generator according to the fifth embodiment of the present invention.
Figure 13:
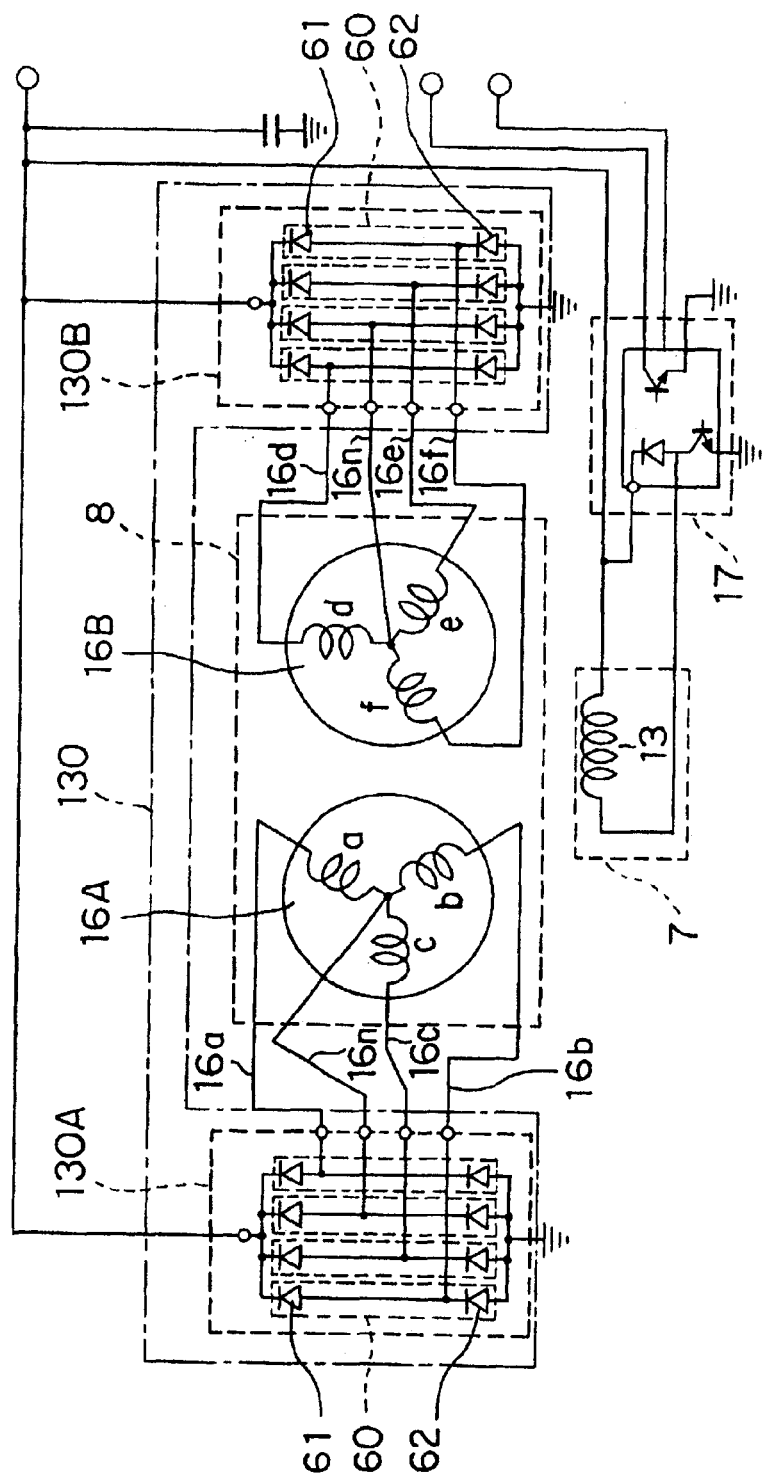
FIG. 13 is a circuit diagram of the vehicle AC generator according to the fifth embodiment of the present invention.

FIGS. 11 and 12 are assembly and top plan views, respectively, of a rectifier unit equipped in a vehicle AC generator according to a fifth embodiment of the present invention; and FIG. 13 is a circuit diagram of the vehicle AC generator according to the fifth embodiment of the present invention.

In FIG. 13, each of stator coils 16A and 16B is formed by Y-connection of three windings having respective phase differences of 120° at an electrical angle. The stator coils 16A and 16B have a phase difference of 30° at an electrical angle with each other, for example. A rectifier unit 130A is formed of three pairs of diode bridges comprising the unidirectionally conducting elements 61 and 62 for the positive- and negative-electrode sides for full-wave rectifying a three-phase AC voltage output from output terminals of the stator coil 16A and one pair of diode bridges comprising the unidirectionally conducting elements 61 and 62 for the positive- and negative-electrode sides for outputting a ripple-current component via the neutral point of the stator coils 16A. Similarly, a rectifier unit 130B is formed of three pairs of diode bridges comprising the unidirectionally conducting elements 61 and 62 for the positive- and negative-electrode sides for full-wave rectifying a three-phase AC voltage output from output terminals of the stator coil 16B and one pair of diode bridges comprising the unidirection ally conducting elements 61 and 62 for the positive- and negative-electrode sides for outputting a ripple-current component via the neutral point of the stator coil 16B. The DC outputs from the rectifier units 130A and 130B are connected in parallel to be combined together so that the pulsating output voltage converted into the direct current is reduced.

A rectifier unit 130 according to the fifth embodiment is formed by combining the rectifier units 130A and 130B in one piece.

In FIGS. 11 and 12, the rectifier unit 130 is provided with one pair of cooling plates 80 and 81 for the positive- and negative-electrode sides and the eight diode packages 60 supported between the cooling plates 80 and 81 for the positive- and negative-electrode sides.

The cooling plates 80 and 81 for the positive- and negative-electrode sides are aluminum plates formed to be substantially horseshoe-shaped each having eight concave portions 80a and 81a for arranging the diode packages 60 therein formed on respective principal planes by being circumferentially aligned thereon. The cooling plates 80 and 81 for the positive- and negative-electrode sides are nickel-plated. The diode packages 60 are arranged within the respective concave portions 81a, each diode package having the connecting lead 63c of the AC input terminal 63 directed radially outwardly with respect to the shaft, so that the base 65b for the negative-electrode side is soldered on the internal bottom surface of the concave portion 81a, and thereby the diode packages 60 are attached to the cooling plate 81 for the negative-electrode side. Furthermore, the cooling plate 80 for the positive-electrode side is placed on the cooling plate 81 for the negative-electrode side via the insulating mold 59 so as to arrange the diode packages 60 in the respective concave portions 80a, so that the base 65a for the positive-electrode side is soldered on the internal bottom surface of the concave portions 80a. Like in the first embodiment, for the junction between the cooling plate 81 for the negative-electrode side and the base 65b for the negative-electrode side, the binary eutectic alloy of 95% Pb—5% Sn is used while for the junction between the cooling plate 80 for the positive-electrode side and the base 65a for the positive-electrode side, a solder of 100% Sn is used.

Thereby, each base 65a for the positive-electrode side of the eight diode packages 60 is short-circuited by the cooling plate 80 for the positive-electrode side, so that the rectifier unit 130 is obtained wherein each base 65b for the negative-electrode side of the eight diode packages 60 is short-circuited by the cooling plate 81 for the negative-electrode side. Although not shown in the drawings, the rectifier unit 130 is arranged coaxially with the shaft so that the principal planes of the cooling plates 80 and 81 for the positive- and negative-electrode sides are placed orthogonal to the longitudinal axis of the shaft, and the rectifier unit 130 is attached and fixed to the rear bracket with screws. At this time, the cooling plate 81 for the negative-electrode side is electrically connected to the rear bracket, and thereby the base 65b for the negative-electrode side is grounded.

In the rectifier unit 130 formed as above, the respective leads 16a through 16c and 16n of the stator coil 16A are connected to the connecting leads 63c of the four diode packages 60 shown in the right side of FIG. 12 while the respective leads 16d through 16f and 16n of the stator coil 16B are connected to the connecting leads 63c of the four diode packages 60 shown in the left side of FIG. 12, so that the circuit shown in FIG. 13 is formed.

In such a manner, according to the fifth embodiment, the rectifier unit 130 is formed by combining in one piece the rectifier units 130A and 130B for respectively three-phase full-wave rectifying currents of two stator coils 16A and 16B, and thereby promoting space saving in the rectifier unit as well as improving efficiency of assembly operations. Furthermore, the vehicle AC generator is miniaturized.

Also, since the diode package 60 formed by depositing the unidirectionally conducting elements 61 and 62 for the positive and negative-electrode sides in one piece is used, the rectifier unit 130 can be constructed by sandwiching the diode packages 60 between the cooling plates 80 and 81 for the positive- and negative-electrode sides. Since the cooling plates 80 and 81 for the positive- and negative-electrode sides are formed to be horseshoe-shaped, a large empty space can be formed in the direction radially inward with respect to the shaft. Therefore, by placing the rectifier unit 130 coaxially with the shaft such that the principal planes of the cooling plates 80 and 81 for the positive- and negative-electrode sides are positioned on planes orthogonal to the axis of the shaft, clearances between the cooling plates 80 and 81 for the positive- and negative-electrode sides and the shaft are large, so that ventilation resistance is reduced, enabling the amount of cooling air to be increased, and thereby improving cooling of the rectifier unit and the stator coil. Also, the diode packages 60 can be placed at externally radial positions with respect to the shaft, in which the temperature of ambient air sucked in is low, enabling cooling efficiency to be improved.

Since the cooling plates 80 and 81 for the positive- and negative-electrode sides are formed to be horseshoe-shaped, the areas of the principal planes of the cooling plates 80 and 81 for the positive- and negative-electrode sides can be increased, enabling a large number of the diode packages to be arranged. That is, the rectifier unit .130, in which eight diode packages 60 are equipped for fully rectifying two sets of stator coils 16A and 16B, can be readily achieved.

Sixth Embodiment

Figure 14:
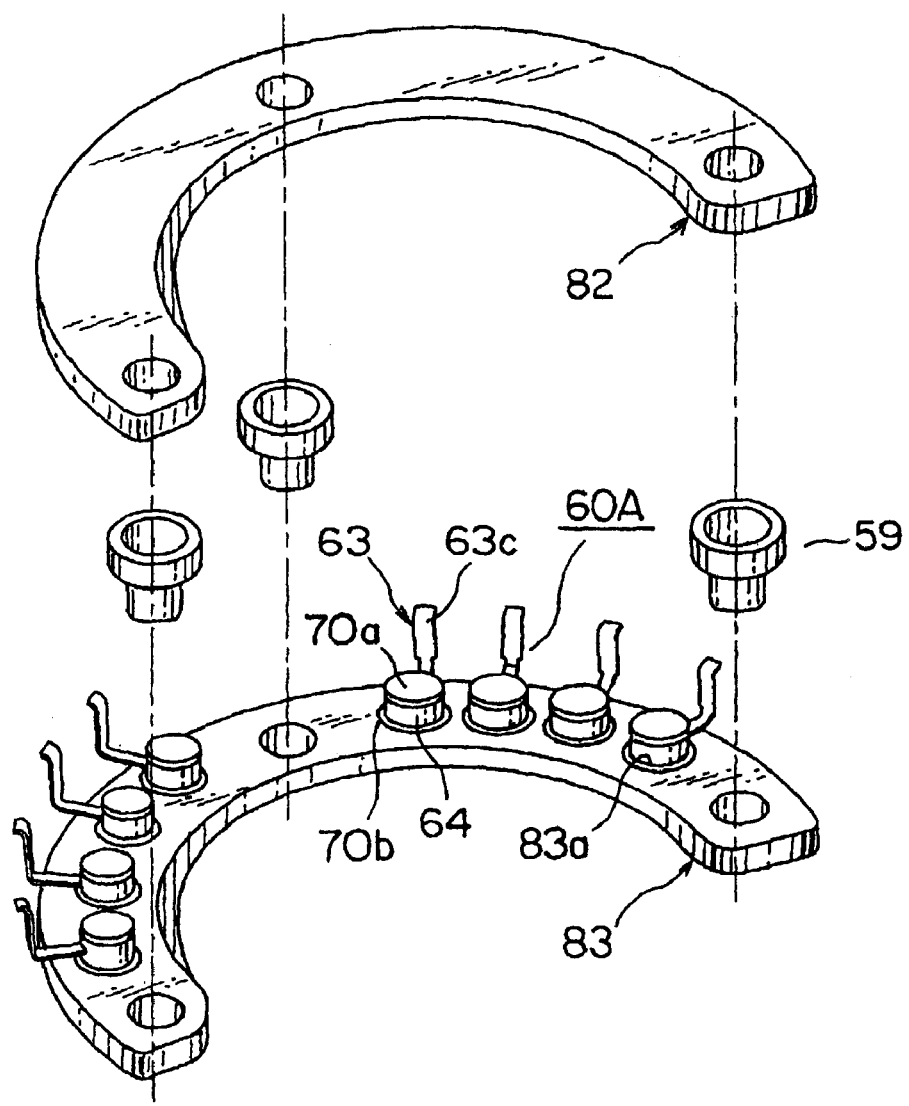
FIG. 14 is an assembly view of a rectifier unit equipped in a vehicle AC generator according to a sixth embodiment of the present invention.

In a sixth embodiment, as shown in FIG. 14, eight circular concave portions 83a are formed to be circumferentially aligned on the principal plane of a cooling plate 83 for the negative-electrode side, so that a base 70b for the negative-electrode side of a diode package 60A is press-fitted into the concave portion 83a so as to attach the diode package 60A to the cooling plate 83 for the negative-electrode side. Although not shown in the drawing, circular concave portions are also formed to be circumferentially aligned on the principal plane of a cooling plate 82 for the positive-electrode side.

In addition, the other configurations are the same as those in the fifth embodiment.

Therefore, according to the sixth embodiment, in addition to the effects in the fifth embodiment, the effects in the second embodiment can also be obtained.

Seventh Embodiment

Figure 15:
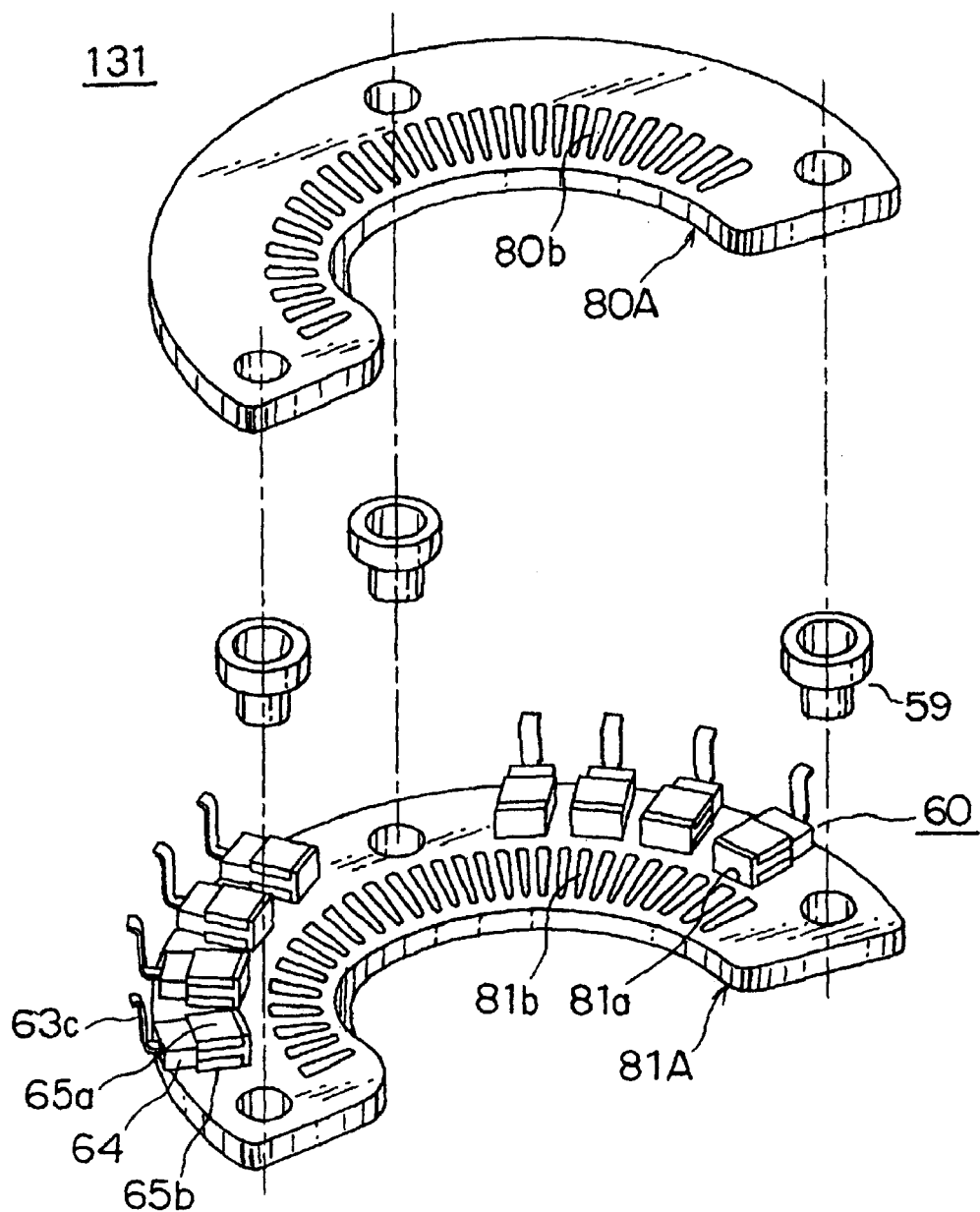
FIG. 15 is an assembly view of a rectifier unit equipped in a vehicle AC generator according to a seventh embodiment of the present invention.
Figure 16:
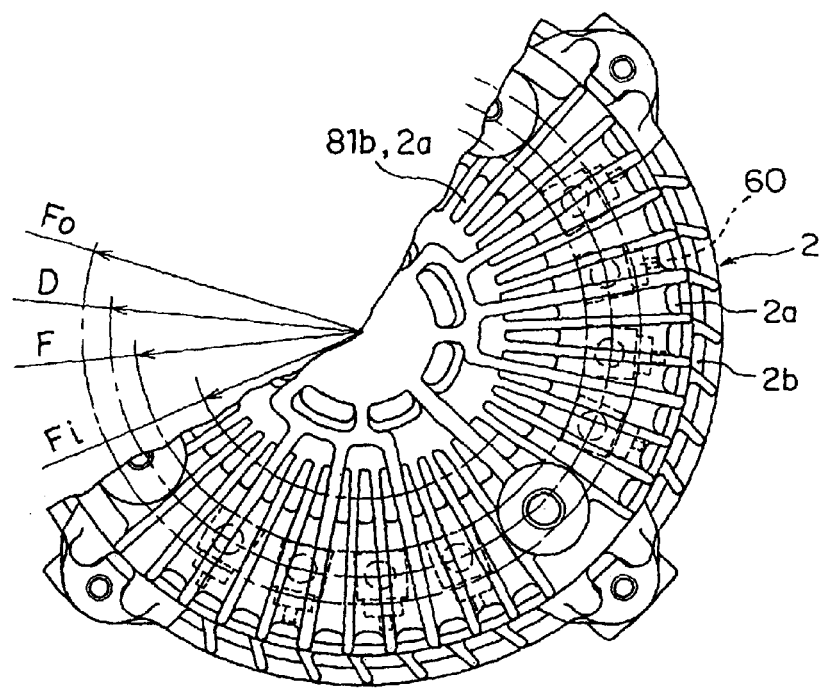
FIG. 16 is a front view of an essential part of the vehicle AC generator according to the seventh embodiment of the present invention when viewed from the rear side.
Figure 17:
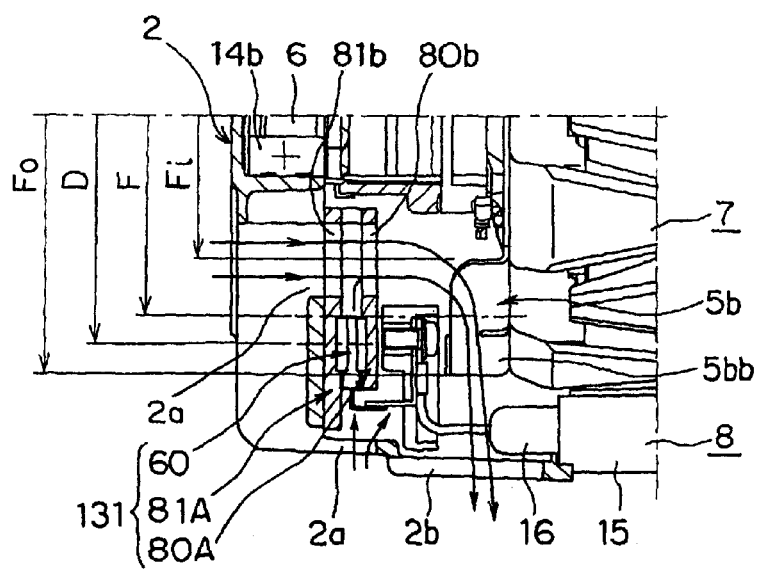
FIG. 17 is a sectional view showing an essential part of the vehicle AC generator according to the seventh embodiment of the present invention.

FIG. 15 is an assembly view of a rectifier unit equipped in a vehicle AC generator according to a seventh embodiment of the present invention; FIG. 16 is a front view of an essential part of the vehicle AC generator according to the seventh embodiment of the present invention when viewed from the rear side; and FIG. 17 is a sectional view showing an essential part of the vehicle AC generator according to the seventh embodiment of the present invention.

In a rectifier unit 131 according to the seventh embodiment, as shown in FIG. 15, a cooling plate 80A for the positive-electrode side is an aluminum plate formed to be substantially horseshoe-shaped and has eight concave portions (not shown) circumferentially formed on the outer boundary side of the principal plane thereof and a large number of ventilation through-holes 80b each radially formed on the inner boundary side of the cooling plate 80A.

Similarly, a cooling plate 81A for the negative-electrode side is an aluminum plate formed to be substantially horseshoe-shaped and has eight concave portions 81a circumferentially formed on the outer boundary side of the principal plane thereof and a large number of ventilation through-holes 81b each radially formed on the inner boundary side of the cooling plate 81A. In addition, the cooling plates 80A and 81A for the positive- and negative-electrode sides are nickel-plated. The cooling plates 80A and 81A for the positive- and negative-electrode sides are stacked together via the insulating mold 59 so as to oppose the respective principal planes to each other and also to oppose the ventilation through-holes 80b and 81b to each other. Thereby, in the diode package 60, the base 65a for the positive-electrode side is soldered to the concave portion of the cooling plate 80A for the positive-electrode side while the base 65b for the negative-electrode side is soldered to the concave portion 81a of the cooling plate 81A for the negative-electrode side.

In addition, the other configurations are the same as those in the fifth embodiment.

The rectifier unit 131 formed as above are, as shown in FIGS. 16 and 17, coaxially arranged with respect to the shaft 6 within the rear bracket 2 so that the principal planes of the cooling plates 80A and 81A for the positive- and negative-electrode sides are placed on planes orthogonal to the shaft 6. The rectifier unit 131 is secured to the rear bracket 2 with tightening screws (not shown). Thereby, the cooling plate 81A for the negative-electrode side is grounded. In each diode package 60, the central point D of the unidirectionally conducting element is arranged in the outer diameter side further than the central point F of fan blades.

Wherein,$F=(Fo+Fi)/2$ provided that Fo is the distance between the axis of the shaft 6 and the outer diameter of the fan blade 5bb; and Fi is the distance between the axis of the shaft 6 and the inner diameter of the fan blade 5bb.

In the vehicle AC generator formed as above, as shown by the arrows in FIG. 17, owing to rotation of the axial-flow fan 5b, the air sucked in the rear bracket 2 from the air intake opening 2a facing the ventilation through-holes 81b of the cooling plate 81A for the negative-electrode side flows into the rotor 7 side via the ventilation through-holes 81b and 80b of the cooling plates 81A and 80A for the negative- and positive-electrode sides so as to be curved in the centrifugal direction by the axial-flow fan 5b, and thereby being exhausted from the air discharge opening 2b. Also, the air sucked in the rear bracket 2 from the air intake opening 2a facing the AC input terminal 63 of the diode package 60 moves in the shaft 6 side via between the cooling plates 81A and 80A for the negative- and positive-electrode sides and flows into the rotor 7 side from the ventilation through-holes 80b so as to be curved in the centrifugal direction by the axial-flow fan 5b, and thereby being exhausted from the air discharge opening 2b. By the cooling airflow, the diode package 60 and the stator 8 are cooled.

As described above, according to the seventh embodiment, in each diode package 60, the central point D of the unidirectionally conducting element is arranged in the outer diameter side further than the central point F of fan blades, so that the cooling plates 80A and 81A for the positive- and negative-electrode sides can extend toward the inner diameter side with respect to the shaft. Thereby, the surface area for cooling of the cooling plates 80A and 81A for the positive- and negative-electrode sides can be increased, enabling the heat generated in the diode package 60 to be effectively dissipated.

The ventilation through-holes 80b and 81b are provided in the inner diameter side of the cooling plates 80A and 81A for the positive- and negative-electrode sides, so that the surface area for cooling can be furthermore increased, enabling the heat generated in the diode package 60 to be furthermore effectively dissipated. In this case, the ventilation through-holes 80b and 81b serve as heat-radiation fins.

Although the clearance between the cooling plates 80A and 81A for the positive- and negative-electrode sides and the shaft 6 is reduced by extending the cooling plates 80A and 81A for the positive- and negative-electrode sides in the inner diameter side, since the ventilation through-holes 80b and 81b are formed in the inner diameter side of the cooling plates 80A and 81A for the positive- and negative-electrode sides, the reduction in the ventilation resistance is restrained so that the amount of cooling air is ensured, enabling the temperature increase in the stator 8 to be restrained.

Furthermore, since the AC input terminal 63 is radially outwardly arranged with respect to the shaft, the AC input terminal 63 is exposed to the cooling air having low temperature, so that the heat generated in the diode package 60 is efficiently dissipated from the AC input terminal 63.

Eighth Embodiment

Figure 18:
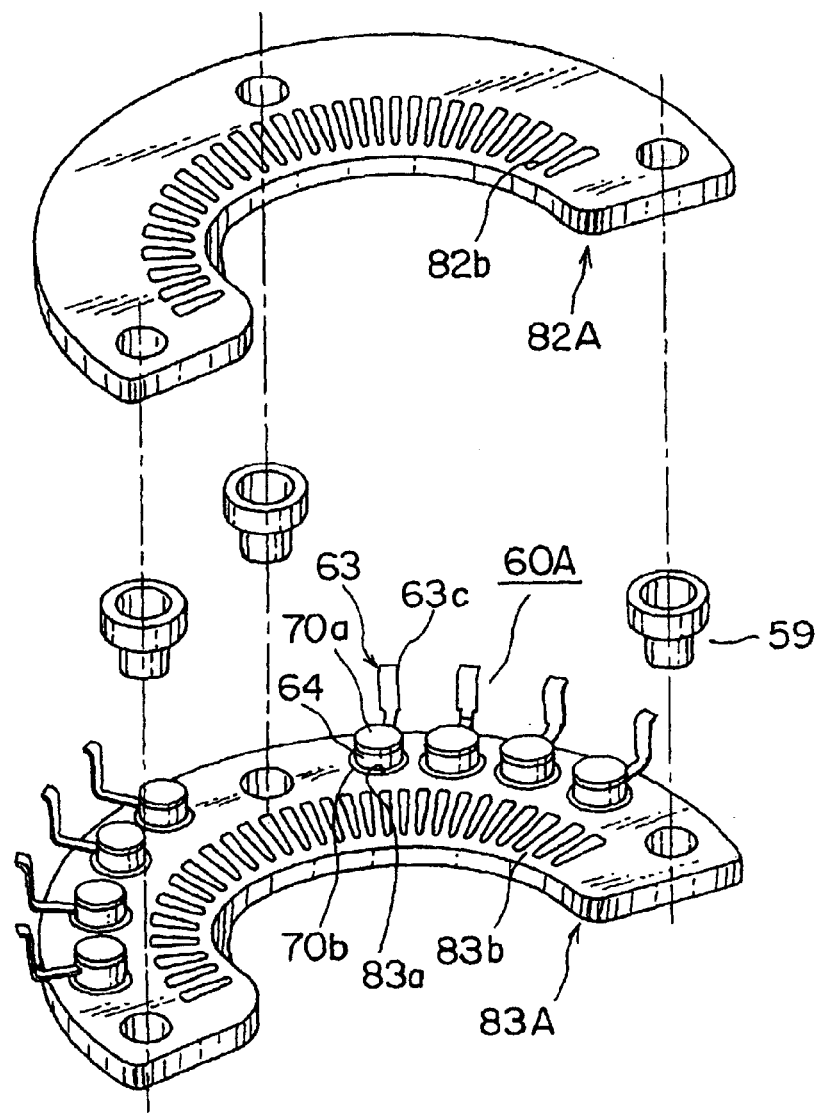
FIG. 18 is an assembly view of a rectifier unit equipped in a vehicle AC generator according to an eighth embodiment of the present invention.

In an eighth embodiment, as shown in FIG. 18, a cooling plate 82A for the positive-electrode side is an aluminum plate formed to be substantially horseshoe-shaped having eight concave portions (not shown) formed on its principal plane by circumferentially aligning in the outer boundary side and a large number of ventilation through-holes 82b each radially formed in the inner boundary side of the cooling plate 82A. Similarly, a cooling plate 83A for the negative-electrode side is an aluminum plate formed to be substantially horseshoe-shaped having eight concave portions 83a formed on its principal plane by circumferentially aligning in the outer boundary side and a large number of ventilation through-holes 83b each radially formed in the inner boundary side of the cooling plate 83A. In addition, the cooling plates 82A and 83A for the positive- and negative-electrode sides are nickel-plated. The cooling plates 82A and 83A for the positive- and negative-electrode sides are piled up together via the insulating mold 59 so as to oppose the respective principal planes to each other and also to oppose the ventilation through-holes 82b and 83b to each other. Thereby, in the diode package 60A, the base 70a for the positive-electrode side is soldered to the concave portion of the cooling plate 82A for the positive-electrode side while the base 70b for the negative-electrode side is press-fitted to the concave portion 83a of the cooling plate 83A for the negative-electrode side.

In addition, the other configurations are the same as those in the seventh embodiment.

Accordingly, in the eighth embodiment, the same effects as in the seventh embodiment can also be obtained.

According to the eighth embodiment, the base 70b for the negative-electrode side has a side face, knurled thereon and is press-fitted into the concave portion 83a of the cooling plate 83A for the negative-electrode side, so that soldering is only needed for between the base 70a for the positive-electrode side and the cooling plate 82A for the positive-electrode side, resulting in improved efficiency of assembly operations. Also, the required solder material is one kind such as Sn, so that when using solder of Sn, the soldering is performed approximately at a low temperature of 232° C., eliminating oxidation on the soldering surface so as to obtain a large junction force by soldering. In this case, the nickel plating on the base made from copper is omitted, resulting in reduced cost.

Ninth Embodiment

Figure 19:
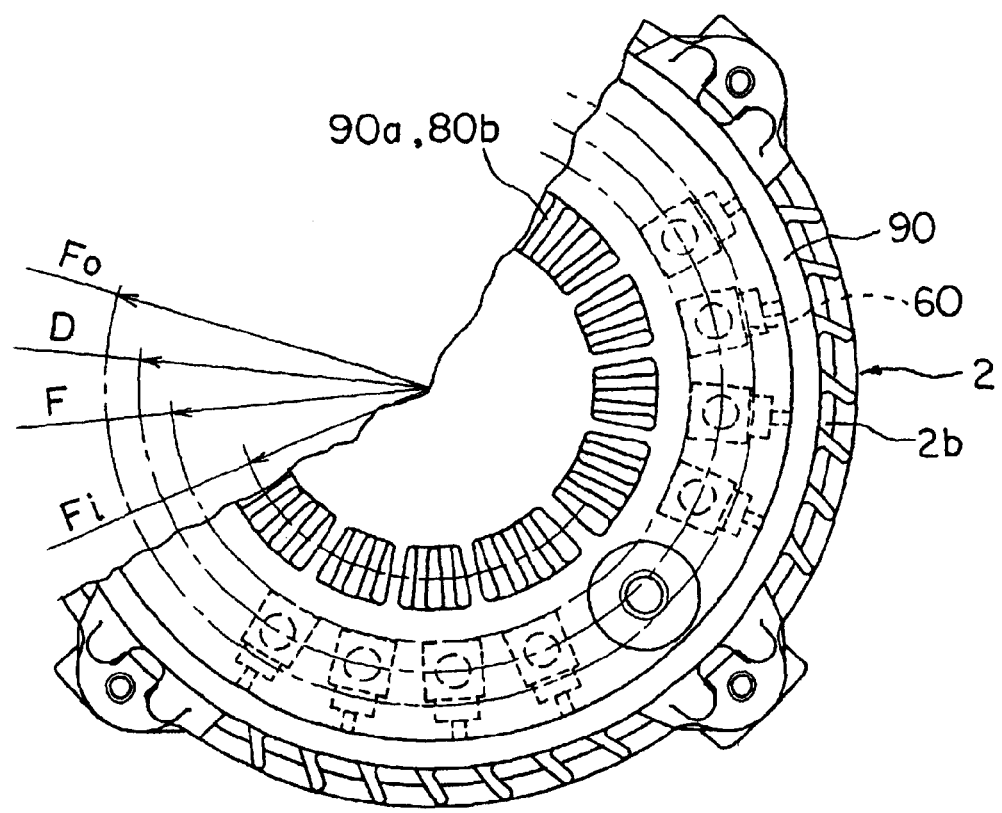
FIG. 19 is a front view of an essential part of a vehicle AC generator according to a ninth embodiment of the present invention when viewed from the rear side.
Figure 20:
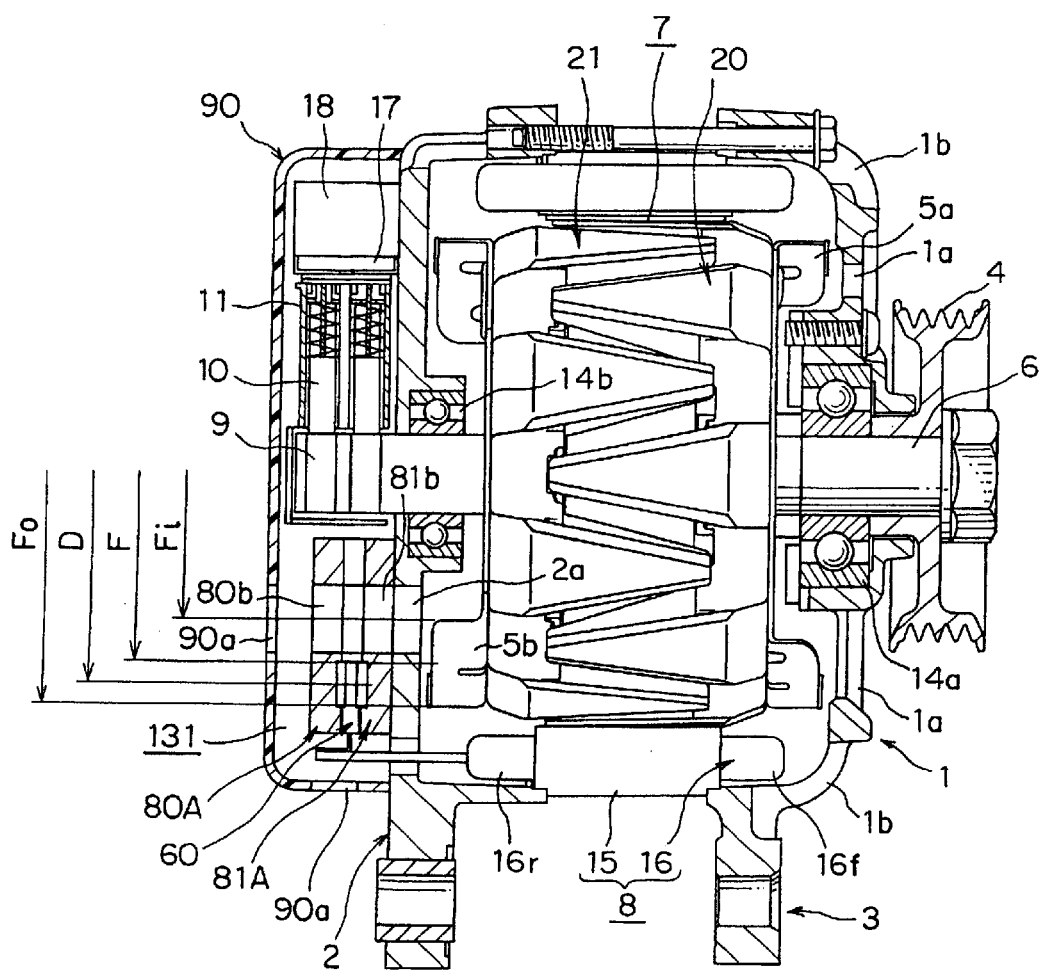
FIG. 20 is a sectional view of the vehicle AC generator according to the ninth embodiment of the present invention.

FIG. 19 is a front view of an essential part of a vehicle AC generator according to a ninth embodiment of the present invention when viewed from the rear side; and FIG. 20 is a sectional view of the vehicle AC generator according to the ninth embodiment of the present invention.

In the ninth embodiment, as shown in FIGS. 19 and 20, the other end of the shaft 6 is extended from the rear bracket 2. The slip rings 9 are disposed in the extended end portion of the shaft 6, and the brushes 10 are disposed so as to tough the slip rings 9 slidably. The rectifier unit 131 is tightened and fixed to the external end face of the rear bracket 2 with tightening screws (not shown), while the cooling plate 81A for the negative-electrode side is grounded. In each diode package 60, the central point D of the unidirectionally conducting element is arranged in the outer diameter side further than the central point F of fan blades. Also, in each diode package 60, the AC input terminal 63 is placed to be radially outwardly oriented with respect to the shaft. Furthermore, a cover 90 made of a resin is equipped in the rear bracket 2 as a case so as to cover the rectifier unit 131 and the brushes 10, etc.

In addition, the other configurations are the same as those in the seventh embodiment.

In the ninth embodiment, owing to rotation of the axial-flow fan 5b, the air sucked in the cover 90 from an air intake opening 90a of the cover 90 facing the ventilation through-holes 80b of the cooling plate 80A for the positive-electrode side flows into the rotor 7 side via the ventilation through holes 80b and 81b of the cooling plates 80A and 81A for the positive- and negative-electrode sides and the air intake opening 2a of the rear bracket 2 so as to be curved in the centrifugal direction by the axial-flow fan 5b, and thereby being exhausted from the air discharge opening 2b. Also, the air sucked in the cover 90 from the air intake opening 90a facing the AC input terminal 63 of the diode package 60 moves in the shaft 6 side via between the cooling plates 80A and 81A for the positive- and negative-electrode sides and flows into the rotor 7 side from the ventilation through-holes 81b and the air intake opening 2a so as to be curved in the centrifugal direction by the axial-flow fan 5b, and thereby being exhausted from the air discharge opening 2b. By the cooling airflow, the diode package 60 and the stator 8 are cooled.

Accordingly, also in the ninth embodiment, the same effects as in the seventh embodiment can also be obtained.

In addition, in the fifth to the ninth embodiment, the diode package 60 or 60A is used, which is formed by depositing one pair of the unidirectionally conducting elements for the positive- and negative-electrode sides in one piece so as to be sealed with the insulating resin 64; however, a modularized diode package may be used, which is formed by depositing four or eight pairs of the unidirectionally conducting elements for the positive- and negative-electrode sides in one piece so as to be sealed with the insulating resin 64. A modularized diode package may also be used, which is formed by depositing three or six pairs of the unidirectionally conducting elements for the positive- and negative-electrode sides in one piece so as to be sealed with the insulating resin 64.

In the fifth to the ninth embodiment, planar metallic plates are used as the cooling plates for the positive- and negative-electrode sides; however, a planar metallic plate having heat-radiation fins formed thereon may be used.

In the above-mentioned each embodiment, the cooling plate formed of aluminum is used; however, the cooling plate is not limited to an aluminum plate and any material, as long as it has an excellent thermal conductivity, such as copper may be used.

In the above-mentioned each embodiment, the current from one or two pairs of AC three-phase-connected stator coils is rectified in the full-wave; however, it is needless to say that the current from three or more pairs of AC three-phase-connected stator coils is rectified in the full-wave according to the present invention.

Also, in the seventh to the ninth embodiment, the axial-flow fan is provided at least at one end of the rotor and the rectifier unit is arranged in the inlet side of the fan; however, the fan may be arranged outside the case; also the fan may be omitted by utilizing the ventilation function of the shoulder portions of the claw-shaped magnetic poles, which forms ventilation means in this case.

In the above-mentioned each embodiment, it is described that sets of the unidirectionally conducting elements for the positive- and negative-electrode sides deposited in one piece are aligned in one row; however, the present invention is not limited to sets of the unidirectionally conducting elements for the positive- and negative-electrode sides deposited in one piece that are aligned in one row, so that it may be applied to sets of the unidirectionally conducting elements for the positive- and negative-electrode sides deposited in one piece that are aligned in two rows, for example.

The vehicle AC generator according to the present invention is formed as described above so that it produces the following effects.

According to the present invention, there is provided a vehicle AC generator comprising: a case; a shaft journaled in the case; a rotor secured to the shaft so as to be disposed in the case; a stator supported by the case so as to be disposed to cover the external periphery of the rotor; ventilating means rotated together with the rotor; and a rectifier unit cooled by the ventilating means, the rectifier unit comprising: cooling plates for the positive-electrode and negative-electrode sides disposed at a predetermined interval and each having principal planes opposing each other; and a diode package disposed between the cooling plates for the positive-electrode and negative-electrode sides, the diode package comprising: a unidirectionally conducting element for the positive-electrode side; a unidirectionally conducting element for the negative-electrode side having a cathode face joined to an anode face of the unidirectionally conducting element for the positive-electrode side by interposing an AC input terminal therebetween; a base for the positive-electrode side formed of a metallic plate and joined to a cathode face of the unidirectionally conducting element for the positive-electrode side; a base for the negative-electrode side formed of a metallic plate and joined to an anode face of the unidirectionally conducting element for the negative-electrode side; and an insulating resin provided so that the unidirectionally conducting elements for the positive-electrode and negative-electrode sides are embedded therein, at least end faces of the respective bases for the positive-electrode and negative-electrode sides are exposed therefrom on both sides in the depositing direction of the unidirectionally conducting elements for the positive-electrode and negative-electrode sides, and the top end of the AC input terminal extends therefrom, wherein in the diode package, the end face of the base for the positive-electrode side is joined to the principal plane of the cooling plate for the positive-electrode side while the end face of the base for the negative-electrode side is joined to the principal plane of the cooling plate for the negative-electrode side. With these features, a compact vehicle AC generator can be obtained, wherein the heat generated in the unidirectionally conducting elements of the rectifier unit is efficiently dissipated so as to restrain the temperature increase in the elements; the number of parts of the rectifier unit is reduced so that man-hour of the assembly work is reduced; and damages of elements of the rectifier unit during the assembling can be restrained as well.

In the diode package, preferably, any one of $3n$ sets and $4n$ sets of the unidirectionally conducting elements for the positive-electrode and negative-electrode sides, each set of the unidirectionally conducting elements for the positive-electrode and negative-electrode sides constituted by depositing the unidirectionally conducting elements for the positive-electrode and negative-electrode sides in one piece by interposing the AC input terminal therebetween, is aligned, cathode faces of the unidirectionally conducting elements for the positive-electrode side constituting any one of $3n$ sets and $4n$ sets of the unidirectionally conducting elements for the positive-electrode and negative-electrode sides are joined to the one base for the positive-electrode side extending in the aligning direction while anode faces of the unidirectionally conducting elements for the negative-electrode side constituting any one of $3n$ sets and $4n$ sets of the unidirectionally conducting elements for the positive-electrode and negative-electrode sides are joined to the one base for the negative-electrode side extending in the aligning direction, and any one of $3n$ sets and $4n$ sets of the unidirectionally conducting elements for the positive-electrode and negative-electrode sides are embedded in the insulating resin. With these features, a rectifier unit capable of three-phase full-wave rectifying the output voltages of plural sets of three-phase AC coils can be readily formed.

The unidirectionally conducting elements for the positive-electrode and negative-electrode sides may be respectively formed of a mesa-type diffusion element made by p-n junction of a p-semiconductor and an n-semiconductor using n-silicon. With these features, the backward surge voltage resistivity of the unidirectionally conducting element is increased, so that the noise propagation to other vehicle components can be prevented, while the foward voltage resistivity is reduced, so that heat producing in the unidirectionally conducting elements is reduced.

Preferably, the face of the base for the positive-electrode side to be joined to the unidirectionally conducting element for the positive-electrode side has the same area as or a larger area than a cathode face area of the unidirectionally conducting element for the positive-electrode side while the face of the base for the negative-electrode side to be joined to the unidirectionally conducting element for the negative-electrode side has the same area as or a larger area than an anode face area of the unidirectionally conducting element for the negative-electrode side, and wherein furthermore the faces of the AC input terminal to be interposed between the unidirectionally conducting elements for the positive-electrode and negative-electrode sides respectively have the same areas as or larger areas than the anode face area of the unidirectionally conducting element for the positive-electrode side and the cathode face area of the unidirectionally conducting element for the negative-electrode side. With these features, the heat of the unidirectionally conducting elements for the positive-electrode and negative-electrode sides is directly thermally conducted to the bases for the positive-electrode and negative-electrode sides while the respective heat is thermally exchanged to each other via the AC input terminal. Therefore, even when the heating value of the unidirectionally conducting element for the positive-electrode side is unbalanced with that of the unidirectionally conducting element for the negative-electrode side, the heat of the unidirectionally conducting element having a larger heating value is thermally conducted to the unidirectionally conducting element having a smaller heating value via the AC input terminal so as to be dissipated from the base joined to the unidirectionally conducting element having a smaller heating value, and thereby temperature increase in the unidirectionally conducting elements can be restrained.

Preferably, the junction area between the base for the positive-electrode side and the cooling plate for the positive-electrode side is the same as or larger than the junction area between the base for the positive-electrode side and the unidirectionally conducting element for the positive-electrode side while the junction area between the base for the negative-electrode side and the cooling plate for the negative-electrode side is the same as or larger than the junction area between the base for the negative-electrode side and the unidirectionally conducting element for the negative-electrode side. With these features, the respective heat of the unidirectionally conducting elements for the positive-electrode and negative-electrode sides is thermally conducted to the cooling plates for the positive-electrode and negative-electrode sides via the bases for the positive-electrode and negative-electrode sides, respectively, so as to be effectively dissipated therefrom.

The AC input terminal may have a joint structure, so that when the vibration transmitted to the stator is transmitted to the rectifier unit via the AC input terminal, the vibration in the joint direction is relieved by- the AC input terminal, enabling damages of the unidirectionally conducting elements to be restrained.

The portion of the AC input terminal extending from the insulating resin may have a bent structure, so that when the vibration transmitted to the stator is transmitted to the rectifier unit via the AC input terminal, the vibration in the bent direction is relieved by the AC input terminal, enabling damages of the unidirectionally conducting elements to be restrained.

The bases for the positive-electrode and negative-electrode sides may be respectively soldered to the cooling plates for the positive-electrode and negative-electrode sides, so that the base and the cooling plate may be joined together without interposition of air therebetween, enabling excellent thermal conductivity to be secured.

Preferably, the bases for the positive-electrode and negative-electrode sides are respectively made from a copper material while respective junction faces of the bases for the positive-electrode and negative-electrode sides to the cooling plates for the positive-electrode and negative-electrode sides are nickel-plated, and thereby eliminating oxidation on the soldering surface during the soldering so as to obtain a large junction force by soldering, while reduction of the joining force by the soldering with passage of time can be restrained so as to obtain high reliability.

At least one of the junction between the base for the positive-electrode side and the cooling plate for the positive-electrode side and the junction between the base for the negative-electrode side and the cooling plate for the negative-electrode side may be performed by press-fitting, so that troublesome soldering processes are reduced, and thereby improving efficiency of assembly operations.

Preferably, the base to be press-fitted extends from the insulating resin in the direction orthogonal to the depositing direction of the unidirectionally conducting elements for the positive-electrode and negative-electrode sides and the extending portion of the base has an external peripheral side knurled thereon. Thereby, the compression load during the press-fitting is not applied to the unidirectionally conducting element, preventing the damage of the element during the press-fitting.

Heat-radiation fins may be provided in an end face of either of the bases for the positive-electrode and negative-electrode sides, so that the base having heat-radiation fins formed thereon serves as a heat-radiating plate, permitting the cooling plate for the positive-electrode side or the cooling plate for the negative-electrode side to be omitted.

Preferably, the ventilating means is composed of a fan, and in the diode package, the central point of the unidirectionally conducting elements for the positive-electrode and negative-electrode sides which are deposited in one piece is arranged to be positioned in the outer diameter side further than the central point of fan blades with respect to the shaft. Therefore, the heat-radiating areas of heat-radiating plates for the positive-electrode and negative-electrode sides can be increased so as to dissipate the heat of the unidirectionally conducting elements for the positive-electrode and negative-electrode sides promptly, and thereby temperature increase in the elements can be efficiently restrained.

Preferably, the cooling plates for the positive-electrode and negative-electrode sides extend inwardly in the radial direction with respect to the shaft, and a large number of ventilating holes are formed in the extending portions of the cooling plates so as to penetrate the extending portion in parallel with the shaft. Therefore, the ventilating holes serve as heat-radiation fins, so that temperature increase in the unidirectionally conducting elements for the positive-electrode and negative-electrode sides can be efficiently restrained, while increase in the ventilation resistance can be restrained by the ventilating holes so as to secure the amount of cooling air, enabling temperature increase in the stator to be restrained.

Preferably, in the diode package, the AC input terminal is radially outwardly oriented with respect to the shaft, and an air intake opening is formed in a portion of the case opposing to the AC input terminal. Therefore, low-temperature ambient air is directly supplied to the AC input terminal so that the heat of the unidirectionally conducting elements for the positive-electrode and negative-electrode sides is dissipated via the AC input terminal, enabling temperature increase in the unidirectionally conducting elements for the positive-electrode and negative-electrode sides to be restrained.

The insulating resin may contain particles of an inorganic calcined product, so that the heat of the unidirectionally conducting elements for the positive-electrode and negative-electrode sides is thermally conducted within the insulating resin and reaches the surface of the insulating resin so as to be dissipated therefrom, enabling temperature increase in the unidirectionally conducting elements for the positive-electrode and negative-electrode sides to be restrained.

What is claimed is:

1. A vehicle AC generator comprising:

a case;

a shaft journaled in the case;

a rotor secured to the shaft so as to be disposed in the case;

a stator supported by the case so as to be disposed to cover the external periphery of the rotor;

ventilating means rotated together with the rotor; and a rectifier unit cooled by the ventilating means, the rectifier unit comprising:

cooling plates for the positive-electrode and negative-electrode sides disposed at a predetermined interval and each having principal planes opposing each other; and at least one diode package disposed between the cooling plates for the positive-electrode and negative-electrode sides, the at least one diode package consisting of:

an AC input terminal;

at least one unidirectionally conducting element for the positive-electrode side;

at least one unidirectionally conducting element for the negative-electrode side having a cathode face joined to an anode face of the at least one unidirectionally conducting element for the positive-electrode side by interposing the AC input terminal therebetween;

at least one base for the positive-electrode side formed of a metallic plate, wherein each of the at least one base for the positive electrode side is joined to a cathode face of one of the at least one unidirectionally conducting element for the positive-electrode side;

at least one base for the negative-electrode side formed of a metallic plate, wherein each of the at least one base for the negative electrode side is joined to an anode face of one of the at least one unidirectionally conducting element for the negative-electrode side; and an insulating resin provided so that the at least one unidirectionally conducting elements for the positive-electrode side and the at least one unidirectionally conducting elements for the negative-electrode side are embedded therein, and the at least one base for the positive electrode side and the at least one base for the negative-electrode side are at least partially embedded therein, wherein at least end faces of the respective bases for the positive-electrode and negative-electrode sides are exposed therefrom on both sides in the depositing direction of the unidirectionally conducting elements for the positive-electrode and negative-electrode sides, and the top end of the AC input terminal extends from the resin;

wherein the end face of the at least one base for the positive-electrode side is joined to the principal plane of the cooling plate for the positive-electrode side, and the end face of the at least one base for the negative-electrode side is joined to the principal plane of the cooling plate for the negative-electrode side.

2. A vehicle AC generator according to claim 1, wherein the unidirectionally conducting elements for the positive-electrode and negative-electrode sides are respectively formed of a mesa-type diffusion element made by p-n junction of a p-semiconductor and an n-semiconductor using n silicon.

3. A vehicle AC generator according to claim 1, wherein the face of the at least one base for the positive-electrode side to be joined to the at least one unidirectionally conducting element for the positive-electrode side has the same area as or a large area than a cathode face area of the at least one unidirectionally conducting electrode for the positive-electrode side while the face of the at least one base for the negative-electrode side to be joined to the at least one unidirectionally conducting element for the negative-electrode side has the same area as or a larger area than an anode face area of the at least one unidirectionally conducting element for the negative-electrode side, and wherein furthermore the faces of the AC input terminal to be interposed between the unidirectionally conducting elements for the positive-electrode and negative-electrode sides respectively have the same areas as or larger areas than the anode face area of the at least one unidirectionally conducting element for the positive-electrode side and the cathode face area of the at least one unidirectionally conducting element for the negative-electrode side.

4. A vehicle AC generator according to claim 1, wherein the junction area between the at least one base for the positive-electrode side and the cooling plate for the positive-electrode side is the same as or larger than the junction area between the at least one base for the positive-electrode side and the at least one unidirectionally conducting element for the positive-electrode side while the junction area between the at least one base for the negative-electrode side and the cooling plate for the negative-electrode side is the same as or larger than the junction area between the at least one base for the negative-electrode side and the at least one unidirectionally conducting element for the negative-electrode side.

5. A vehicle AC generator according to claim 1, wherein the AC input terminal has a joint structure.

6. A vehicle AC generator according to claim 1, wherein the portion of the AC input terminal extending from the insulating resin has a bent structure.

7. A vehicle AC generator according to claim 1, wherein the bases for the positive-electrode and negative-electrode sides are respectively soldered to the cooling plates for the positive-electrode and negative-electrode sides.

8. A vehicle AC generator according to claim 7, wherein the bases for the positive-electrode and negative-electrode sides are respectively made from a copper material while respective junction faces of the bases for the positive-electrode and negative-electrode sides to the cooling plates for the positive-electrode and negative-electrode sides are nickel-plated.

9. A vehicle AC generator according to claim 1, wherein the ventilating means is composed of a fan, and in the diode package, the central point of the unidirectionally conducting elements for the positive-electrode and negative-electrode sides which are deposited in one piece is arranged to be positioned in the outer diameter side further than the central point of fan blades with respect to the shaft.

10. A vehicle AC generator according to claim 9, wherein the cooling plates for the positive-electrode and negative-electrode sides extend inwardly in the radial direction with respect to the shaft, and a large number of ventilating holes are formed in the extending portions of the cooling plates so as to penetrate the extending portion in parallel with the shaft.

11. A vehicle AC generator according to claim 1, wherein the diode package, the AC input terminal is radially outwardly oriented with respect to the shaft, and an air intake opening is formed in a portion of the case opposing to the AC input terminal.

12. A vehicle AC generator according to claim 1, wherein the insulating resin contains particles of an inorganic calcined product.

13. A vehicle AC generator according to claim 1, wherein in the diode package, any one of 3n sets and 4n sets of the unidirectionally conducting elements for the positive-electrode and negative-electrode sides, each set of the unidirectionally conducting elements for the positive-electrode and negative-electrode sides being constructed by depositing the unidirectionally conducting elements for the positive-electrode and negative-electrode sides in one piece by interposing the AC input terminal therebetween, is aligned, cathode faces of the unidirectionally conducting elements for the positive-electrode side constituting any one of 3n sets and 4n sets of the unidirectionally conducting elements for the positive-electrode and negative-electrode sides are joined to the one base for the positive-electrode side extending in the aligning direction while anode faces of the unidirectionally conducting elements for the negative-electrode side constituting any one of 3n sets to 4n sets of the unidirectionally conducting elements for the positive-electrode and negative-electrode sides are joined to the one base for the negative-electrode side extending, in the aligning direction, and any of 3n sets and 4n sets of the unidirectionally conducting elements for the positive-electrode and negative-electrode sides are embedded in the insulating resin.

14. A vehicle AC generator according to claim 13, wherein heat-radiation fins are provided in an end face of either of the bases for the positive-electrode and negative-electrode sides.

15. A vehicle AC generator according to claim 13, wherein the ventilating means is composed of a fan, and in the diode package, the central point of the unidirectionally conducting elements for the positive-electrode and negative-electrode sides which are deposited in one piece is arranged to be positioned in the outer diameter side further than the central point of fan blades with respect to the shaft.

16. A vehicle AC generator according to claim 15, wherein the cooling plates for the positive-electrode and negative-electrode sides extend inwardly in the radial direction with respect to the shaft, and a large number of ventilating holes are formed in the extending portions of the cooling plates so as to penetrate the extending portion in parallel with the shaft.

17. A vehicle AC generator according to claim 13, wherein in the diode package, the AC input terminal is radially outwardly oriented with respect to the shaft, and an air intake opening is formed in a portion of the case opposing to the AC input terminal.

* * * * *